(12) United States Patent
Kleveland et al.

(10) Patent No.: US 6,784,517 B2
(45) Date of Patent: Aug. 31, 2004

(54) THREE-DIMENSIONAL MEMORY ARRAY INCORPORATING SERIAL CHAIN DIODE STACK

(75) Inventors: Bendik Kleveland, Santa Clara, CA (US); N. Johann Knall, Sunnyvale, CA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 0 days.

(21) Appl. No.: 10/253,051

(22) Filed: Sep. 24, 2002

(65) Prior Publication Data

US 2003/0022420 A1 Jan. 30, 2003

Related U.S. Application Data

(60) Division of application No. 09/897,705, filed on Jun. 29, 2001, now Pat. No. 6,631,085, which is a continuation-in-part of application No. 09/814,727, filed on Mar. 21, 2001, now Pat. No. 6,420,215, which is a continuation-in-part of application No. 09/560,626, filed on Apr. 28, 2000, now abandoned.

(60) Provisional application No. 60/277,794, filed on Mar. 21, 2001, provisional application No. 60/277,815, filed on Mar. 21, 2001, and provisional application No. 60/277,738, filed on Mar. 21, 2001.

(51) Int. Cl.$^7$ ............................................. H01L 29/00
(52) U.S. Cl. ..................................................... 257/530
(58) Field of Search ........................ 257/74, 208, 209, 257/211, 528–530; 438/128, 131, 132, 467, 600; 365/96, 103, 225.7

(56) References Cited

U.S. PATENT DOCUMENTS

| | | | |
|---|---|---|---|
| 3,576,549 A | 4/1971 | Hess et al. | 340/173 SP |
| 3,582,908 A | 6/1971 | Koo | 340/173 |
| 3,634,929 A | 1/1972 | Yoshida et al. | 29/577 |
| 3,671,948 A | 6/1972 | Cassen et al. | 340/173 SP |
| 3,717,852 A | 2/1973 | Abbas et al. | 340/173 SP |
| 3,728,695 A | 4/1973 | Frohman-Bentchkowsky | 340/173 R |
| 3,787,822 A | 1/1974 | Rioult | 340/173 SP |
| 3,863,231 A | 1/1975 | Taylor | 340/173 SP |

(List continued on next page.)

OTHER PUBLICATIONS

Peter K. Naji et al, "A 256kb 3.0V 1T1MTJ Nonvolatile Magnetoresistive RAM," 2001 IEEE International Solid–State Circuits Conference, Digest of Technical Papers, ISSCC 2001/Session 7/Technology Directions: Advanced Technologies/7.6, Feb. 6, 2001, pp. 122–123 (including enlargement of figures, totaling 9 pages), and associated Visual Supplement, pp. 94–95, 404–405 (enlargements of slides submitted, totaling 25 pages).

(List continued on next page.)

*Primary Examiner*—Jennifer M. Dolan
(74) *Attorney, Agent, or Firm*—Zagorin, O'Brien & Graham LLP

(57) ABSTRACT

A three-dimensional memory array includes a plurality of rail-stacks on each of several levels forming alternating levels of X-lines and Y-lines for the array. Memory cells are formed at the intersection of each X-line and Y-line. The memory cells of each memory plane are all oriented in the same direction relative to the substrate, forming a serial chain diode stack. In certain embodiments, row and column circuits for the array are arranged to interchange function depending upon the directionality of memory cells in the selected memory plane. High-voltage drivers for the X-lines and Y-lines are each capable of passing a write current in either direction depending on the direction of the selected memory cell. A preferred bias arrangement reverse biases only unselected memory cells within the selected memory plane, totaling approximately $N^2$ memory cells, rather than approximately $3N^2$ memory cells as with prior arrays.

41 Claims, 19 Drawing Sheets

U.S. PATENT DOCUMENTS

| | | | |
|---|---|---|---|
| 3,990,098 A | 11/1976 | Mastrangelo | 357/2 |
| 4,146,902 A | 3/1979 | Tanimoto et al. | 357/6 |
| 4,203,123 A | 5/1980 | Shanks | 357/2 |
| 4,203,158 A | 5/1980 | Frohman-Bentchkowsky et al. | 365/185 |
| 4,229,757 A | 10/1980 | Moussie | 357/59 |
| 4,272,880 A | 6/1981 | Pashley | 29/571 |
| 4,281,397 A | 7/1981 | Neal et al. | 365/189 |
| 4,419,741 A | 12/1983 | Stewart et al. | 365/72 |
| 4,420,766 A | 12/1983 | Kasten | 357/59 |
| 4,442,507 A | 4/1984 | Roesner | 365/100 |
| 4,489,478 A | 12/1984 | Sakurai | 29/574 |
| 4,494,135 A | 1/1985 | Moussie | 357/59 |
| 4,498,226 A | 2/1985 | Inoue et al. | 29/576 B |
| 4,499,557 A | 2/1985 | Holmberg et al. | 365/163 |
| 4,507,757 A | 3/1985 | McElroy | 365/104 |
| 4,543,594 A | 9/1985 | Mohsen et al. | 357/51 |
| 4,569,121 A | 2/1986 | Lim et al. | 29/574 |
| 4,646,266 A | 2/1987 | Ovshinsky et al. | 365/105 |
| 4,820,657 A | 4/1989 | Hughes et al. | 437/172 |
| 4,823,181 A | 4/1989 | Mohsen et al. | 357/51 |
| 4,855,953 A | 8/1989 | Tsukamoto et al. | 365/149 |
| 4,876,220 A | 10/1989 | Mohsen et al. | 437/170 |
| 4,881,114 A | 11/1989 | Mohsen et al. | 357/54 |
| 4,899,205 A | 2/1990 | Hamdy et al. | 357/51 |
| 4,922,319 A | 5/1990 | Fukushima | 357/51 |
| 4,943,538 A | 7/1990 | Mohsen et al. | 437/52 |
| 5,070,383 A | 12/1991 | Sinar et al. | 357/51 |
| 5,070,384 A | 12/1991 | McCollum et al. | 357/51 |
| 5,126,290 A | 6/1992 | Lowrey et al. | 437/235 |
| 5,233,206 A | 8/1993 | Lee et al. | 257/50 |
| 5,306,935 A | 4/1994 | Esquivel et al. | 257/315 |
| 5,311,039 A | 5/1994 | Kimura et al. | 257/50 |
| 5,334,880 A | 8/1994 | Abadeer et al. | 307/219 |
| 5,391,518 A | 2/1995 | Bhushan | 437/190 |
| 5,427,979 A | 6/1995 | Chang | 437/190 |
| 5,441,907 A | 8/1995 | Sung et al. | 437/48 |
| 5,463,244 A | 10/1995 | De Araujo et al. | 257/530 |
| 5,535,156 A | 7/1996 | Levy et al. | 365/175 |
| 5,536,968 A | 7/1996 | Crafts et al. | 257/529 |
| 5,587,944 A | 12/1996 | Shen et al. | |
| 5,640,343 A | 6/1997 | Gallagher et al. | 365/171 |
| 5,675,547 A | 10/1997 | Koga | 365/230.03 |
| 5,737,259 A | 4/1998 | Chang | 365/105 |
| 5,745,407 A | 4/1998 | Levy et al. | 365/159 |
| 5,751,012 A | 5/1998 | Wolstenholme et al. | 257/5 |
| 5,776,810 A | 7/1998 | Guterman et al. | 438/258 |
| 5,793,697 A | 8/1998 | Scheuerlein | 365/230.07 |
| 5,818,749 A | 10/1998 | Harshfield | |
| 5,835,396 A | 11/1998 | Zhang | 365/51 |
| 5,883,409 A | 3/1999 | Guterman et al. | 257/316 |
| 5,953,249 A | 9/1999 | Van der Wagt | |
| 5,991,193 A | 11/1999 | Gallagher et al. | 365/171 |
| 6,034,882 A | 3/2000 | Johnson et al. | 365/103 |
| 6,055,180 A | 4/2000 | Gudesen et al. | 365/175 |
| 6,130,835 A | 10/2000 | Scheuerlein | 365/171 |
| 6,185,122 B1 | 2/2001 | Johnson et al. | 365/103 |

OTHER PUBLICATIONS

Kim C. Hardee and Rahul Sud, "A Fault–Tolerant 30 ns/375 mW 16K×1 NMOS Static RAM,"IEEE Journal of Solid–State Circuits, vol. SC–16, No. 5, Oct. 1981, pp. 435–443.

Toshio Wada et al, "A 15–ns 1024–Bit Fully Static MOS RAM," IEEE Journal of Solid–State Circuits, vol. SC–13, No. 5, Oct. 1978, pp. 635–639.

C. De Graff et al., "A Novel High–Density Low–Cost Diode Programmable Read Only Memory," IEEE 1996 International Electron Devices Meeting Technical Digest, San Francisco, CA, Dec. 1996, pp. 189–192.

U.S. app. No. 09/897,785, filed Jun. 29, 2001, "Method and Apparatus for Writing Memory Arrays Using External Source of High Programming Voltage," inventor Roy E. Scheuerlein, 68 pp.

U.S. app. No. 09/897,771, filed Jun. 29, 2001, "Method and Apparatus for Biasing Selected and Unselected Array Lines When Writing a Memory Array," inventor Roy E. Scheuerlein, 76 pp.

U.S. app. No. 09/897,784, filed Jun. 29, 2001, "Method and Apparatus for Discharging Memory Array Lines," inventors Roy E. Scheuerlein and Matthew Crowley, 70 pp.

U.S. app. No. 09/896,468, filed Jun. 29, 2001, "Current Sensing Method and Apparatus Particularly Useful for a Memory Array of Cells having Diode–Like Characteristics," inventor Roy E. Scheuerlein, 54 pp.

U.S. app. No. 09/897,704, filed Jun. 29, 2001, "Memory Array Incorporating Noise Detection Line," inventor Roy E. Scheuerlein, 46 pp.

U.S. app. No. 09/560,626, filed Apr. 28, 2000, "Three–Dimensional Memory Array of Fabrication," inventor Johan Knall, 48 pp.

U.S. app. No. 09/638,428, filed Aug. 14, 2000, "Low Cost Three–Dimensional Memory Array," inventors Mark G. Johnson et al., 25 pp.

U.S. app. No. 09/814,727, filed Mar. 21, 2001, "Three–Dimensional Memory Array and Method of Fabrication," inventors Johan Knall and Mark G. Johnson, 49 pp.

U.S. app. No. 09/896,814, filed Jun. 29, 2001, "Memory Device with Row and Column Decoder Circuits Arranged in a Checkerboard Pattern Under a Plurality of Memory Arrays," inventor Roy E. Scheuerlein, 28 pp.

U.S. app. No. 09/896,815, filed Jun. 29, 2001, "Memory Device and Method for Sensing While Programming a Non–Volatile Memory Cell," inventors Bendik Kleveland et al., 26 pp.

U.S. app. No. 09/746,341, filed Dec. 22, 2000, "Contact and Via Structure and Method of Fabrication," inventor James M. Cleeves, 47 pp.

U.S. app. No. 09/895,960, filed Jun. 29, 2001, "Method and System for Increasing Programming Bandwidth in a Non–Volatile Memory Device," inventors Christopher S. Moore et al, 21 pp.

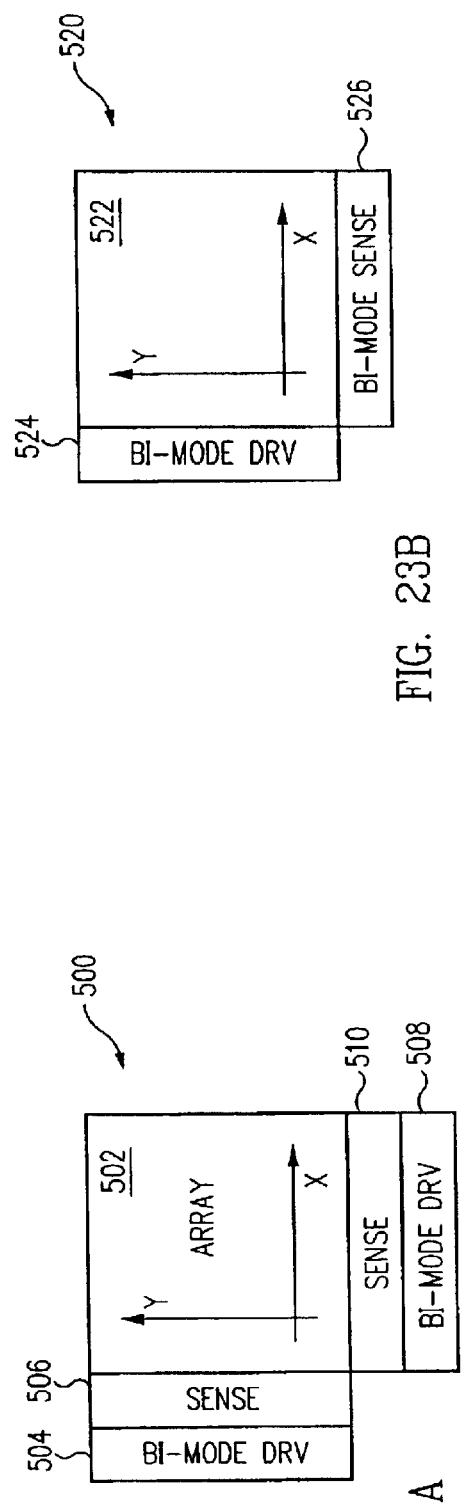

THREE-DIMENSIONAL MEMORY ARRAY INCORPORATING SERIAL CHAIN DIODE STACK

CROSS-REFERENCE TO RELATED APPLICATIONS

This application is a divisional of Prior application Ser. No. 09/897,705, filed Jun. 29, 2001 now U.S. Pat. No. 6,631,085, the entirety of which is incorporated herein by reference, which is a continuation-in-part of U.S. application Ser. No. 09/814,727, filed Mar. 21, 2001 now U.S. Pat. No. 6,420,215, which is a continuation-in-part of U.S. application Ser. No. 09/560,626, filed Apr. 28, 2000 now abandoned; which Prior Application also claims the benefit of the following U.S. provisional applications, each of which was filed on Mar. 21, 2001: U.S. Provisional Application No. 60/277,794; U.S. Provisional Application No. 60/277,815; and U.S. Provisional Application No. 60/277,738. Each of the above-referenced applications is hereby incorporated by reference.

BACKGROUND OF THE INVENTION

Field of the Invention

The present invention relates to low cost, high-density semiconductor memories and, in particular, to one-time-programmable semiconductor memories. More particularly, the invention relates to the field of vertically stacked field programmable non-volatile memory, support circuits useful therewith, and methods of fabrication thereof.

Recently there has been an interest in fabricating memories having memory cells disposed at numerous levels above a substrate. Each level includes a plurality of spaced-apart first lines extending in one direction which are vertically separated from a plurality of parallel spaced-apart second lines in a second direction, for example, extending perpendicular to the first lines. Cells are disposed between the first lines and second lines at the intersections of these lines. These memories are described, for example, in U.S. Pat. Nos. 5,835,396 and 6,034,882.

Another way of fabricating three-dimensional memory arrays departs from the structures shown in these patents and uses "rail-stacks" as described in U.S. patent application Ser. No. 09/560,626 by N. Johan Knall, filed Apr. 28, 2000, which application describes a memory employing antifuses where a diode is formed upon programming a particular bit. In this connection see, "A Novel High-Density Low-Cost Diode Programmable Read Only Memory," by de Graaf, Woerlee, Hart, Lifka, de Vreede, Janssen, Sluijs and Paulzen, *IEDM*-96, beginning at page 189 and U.S. Pat. Nos. 4,876,220; 4,881,114 and 4,543,594.

SUMMARY OF THE INVENTION

A three-dimensional memory array includes a plurality of rail-stacks on each of several levels forming alternating levels of X-lines and Y-lines for the array. Memory cells are formed at the intersection of each X-line and Y-line. The plurality of X-lines on a given layer is associated with both a memory plane above the layer and another memory plane below the layer. Likewise, the plurality of Y-lines on a given layer is associated with both a memory plane above the layer and another memory plane below the layer. The memory cells of each memory plane are all oriented in the same direction relative to the substrate, forming a serial chain diode stack.

In certain embodiments, row and column circuits for the array are arranged to interchange function depending upon the directionality of memory cells in the selected memory plane. In particular, in a write mode high-voltage drivers for the row lines and column lines are each capable of passing a write current in either direction depending on the direction of the selected memory cell.

By arranging the memory array with memory cells in all memory planes oriented in the same direction, a preferred bias arrangement reverse biases only unselected memory cells within the selected memory plane, totaling approximately $N^2$ memory cells, rather than $3N^2$ memory cells as with back-to-back diode stack memory arrays.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

FIG. 22 is a chart of preferred bias voltages for several modes in accordance with the present invention.

FIG. 23A is a block diagram of an array organization incorporating a bi-mode driver circuit and a sense circuit block on each of two adjacent sides of the array.

FIG. 23B is a block diagram of an array organization incorporating a bi-mode driver circuit on one side of an array and a sense circuit block on an adjacent side of the array.

DETAILED DESCRIPTION

Figure 1:
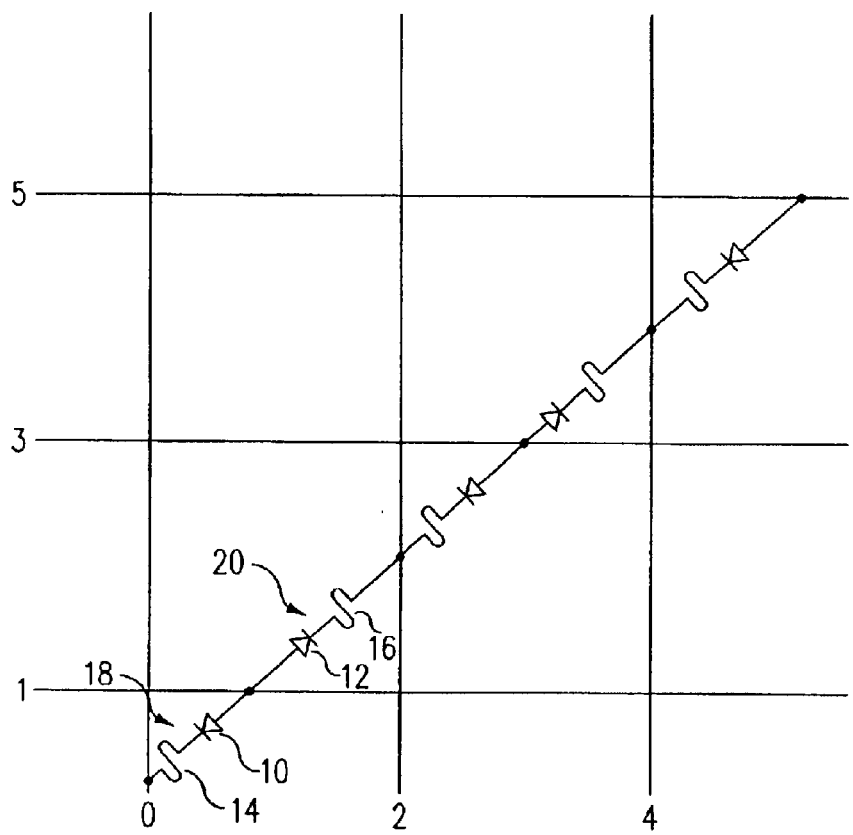
FIG. 1 is an electrical schematic diagram of a back-to-back diode stack-type memory array.

Embodiments of the present invention are described herein in the context of a three-dimensional memory array and methods of fabrication and use thereof. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Three-dimensional memory arrays present the issue of how to program selected cells without inadvertently programming unselected cells. One way this can be done is by reverse-biasing every unselected cell. There are drawbacks to this approach. Most programmable elements present some leakage current flow when reverse-biased. Accordingly, where that is the case, it is desirable to minimize the number of reverse-biased elements to avoid unnecessary power consumption. This is particularly important in consumer products and battery powered devices.

Another approach is to reverse-bias only those cells that are adjacent to the cells being programmed. This would normally involve reverse-biasing all unselected cells in the plane of the selected cell(s) and all cells in the planes of cells immediately adjacent to the plane of the cell(s) being programmed. This again presents the drawback of having to reverse-bias (for an N×N array of cells in a plane) approximately $3N^2$ cells (less, of course, those being programmed).

In accordance with the present invention, the programmable elements are arranged as a serial chain diode stack such that only the unselected programmable elements in the plane in which elements are being programmed need to be reverse-biased. Since for an N×N array, this will only be approximately $N^2$ elements (less, of course, any being programmed), this approach only reverse-biases approximately one-third of the programmable elements and therefore the wasted power due to leakage is expected to be only one-third of the earlier-described method.

For the purposes of this discussion, programmable elements are generally memory elements having a current steering element directing current in a direction and another component which is capable of changing its state (e.g., a fuse, an antifuse, a capacitor, a resistive element, etc.). In a preferred embodiment of the present invention, the memory element used is a diode-like structure having a p+ terminal separated from an n− terminal by an antifuse element. When the antifuse element is programmed in a conventional manner, the p+ terminal is electrically connected to the n− terminal and forms a conventional diode. The programming state of the memory element can be read by sensing current flow or voltage drop when the memory element is selected.

U.S. Pat. No. 6,034,882 to Johnson, et al., referred to above, utilizes a back-to-back diode stack similar to that illustrated in FIG. 1 in which the current steering elements 10, 12 are sequentially directed in opposite directions (e.g., up, down, up down, etc.) and then coupled to state change elements 14, 16. Together, elements 10, 14 and 12, 16 form programmable cells 18, 20, respectively. The implication of this scheme is that approximately $3N^2$ diodes are reverse-biased during writes, resulting in a relatively large leakage current. This large leakage current may set an upper limit on the array size that can practically be used, which, in turn, directly affects the area efficiency of the overall device. It also requires that the fabrication process fabricate alternate layers of np and pn diodes, thus increasing the process complexity.

Figure 2:
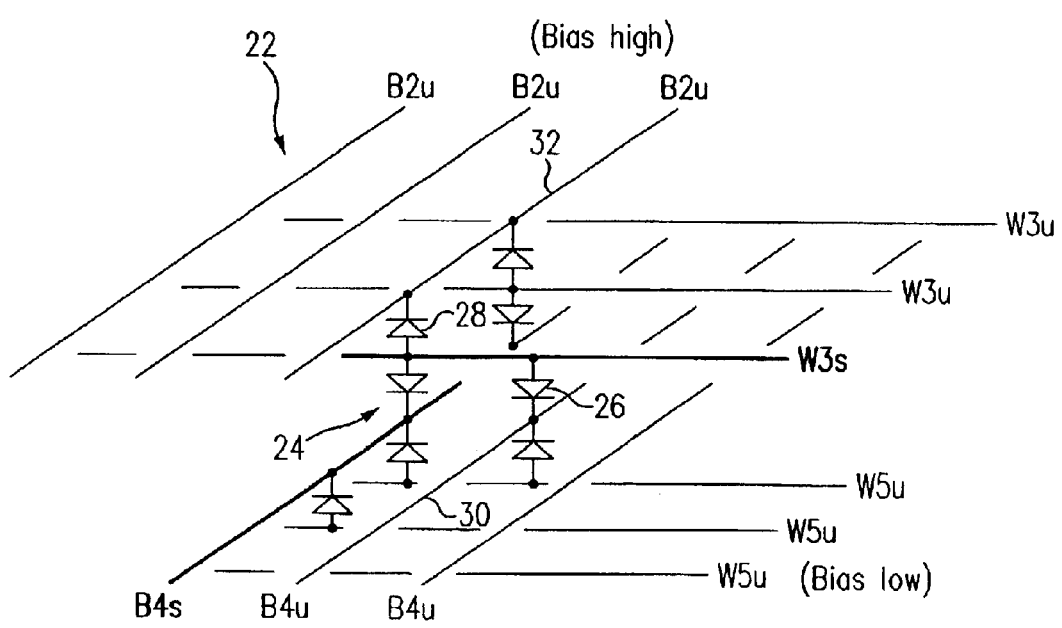
FIG. 2 is a three-dimensional electrical schematic diagram illustrating reversed bias diode leakage in a back-to-back diode stack-type memory array.

Turning now to FIG. 2, a diagram illustrating a section of a multi-level memory array 22 having bit lines B2 and B4 and word lines W3 and W5 is shown. Memory array 22 uses back-to-back diodes. In the diagram of FIG. 2, the designation "u" after a bit line or word line designation means that the corresponding bit line or word line is unselected. The designation "s" after a bit line or word line designation means that the corresponding bit line or word line is selected. In FIG. 2 the highlighted word line W3s and bit line B4s are selected. Thus by driving W3s high relative to B4s it is possible to program cell 24 so that it conducts from W3s to B4s. For simplification, only a diode and not an antifuse is shown at the selected cell, as once programmed, the cell acts like a diode. When driving W3s high it is also possible to program all of the other cells coupled to W3s, eg, cells 26 and 28. Thus, to avoid programming these cells, the corresponding bit lines should be biased to a level which precludes programming the cells. For example, making the bias on bit line 30 comparable to the bias on word line W3s will prevent cell 26 from programming. Similarly, making the bias on bit line 32 comparable to that of W3s will prevent cell 28 from programming. On the other hand, unselected word lines, W3u, must be kept relatively low in order to avoid accidentally reading or writing other cells connected to bit line B4s. Likewise, the unselected bit lines, B4u, must be kept relatively high in order to avoid accidentally reading or writing other cells connected to word line W3s. Hence, all of the unselected cells in the plane W3-B4 will be reverse-biased. Moreover, in order to avoid accidentally reading or writing cells in the plane B4-W5, all of the word lines W5u must be biased low. It is therefore clear that the unselected memory cells in plane W3-B4 as well as the unselected memory cells in the plane B2-W3 and the unselected memory cells in the plane B4-W5 are reverse-biased. Hence, for an array having N×N memory cells in each plane, approximately $3N^2$ memory cells are reverse-biased. Such leakage currents are described in greater detail and preferred bias voltages of the unselected word lines and bit lines are set forth in "Method and Apparatus for Biasing Selected and Unselected Array Lines When Writing a Memory Array" by Roy E. Scheuerlein, U.S. patent application Ser. No. 09/897,771, filed Jun. 29, 2001, and is hereby incorporated by reference.

Figure 3:
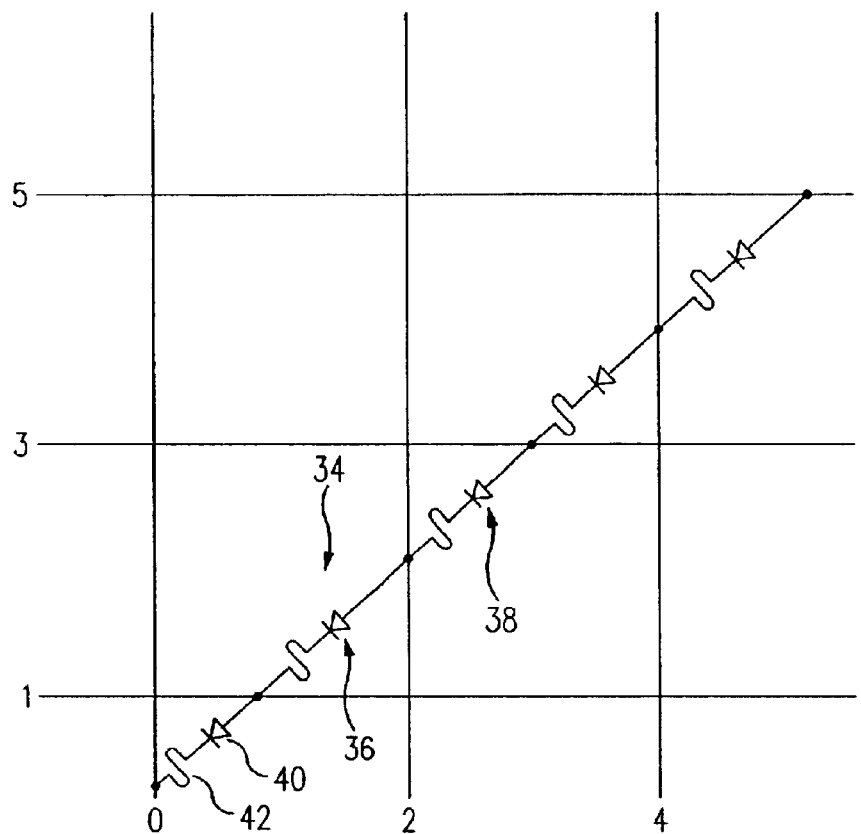
FIG. 3 is an electrical schematic diagram of a serial chain diode stack-type memory array in accordance with one specific embodiment of the present invention.

In accordance with a specific embodiment of the present invention, the power consumption of the memory arrays fabricated in accordance with the principles of the present invention may be reduced significantly by implementing the programmable elements as a serial chain stack 34 as illustrated in FIG. 3 so that the current steering elements 36, 38 are all directed in a common direction (e.g., up or down relative to the substrate).

In accordance with this specific embodiment of the present invention, a serial chain diode stack 34 in accordance with the schematic illustration of FIG. 3 is used. Each element 36, 38 includes a steering element 40 and an antifuse element 42. This approach has several advantages over those discussed above. First, it only requires one type of pn diode, and therefore simplifies the process development and manufacturing, potentially improving the yield (as described below). It also reduces the reverse-bias leakage during a write because only approximately $N^2$ diodes are reverse-biased during the write.

Figure 4:
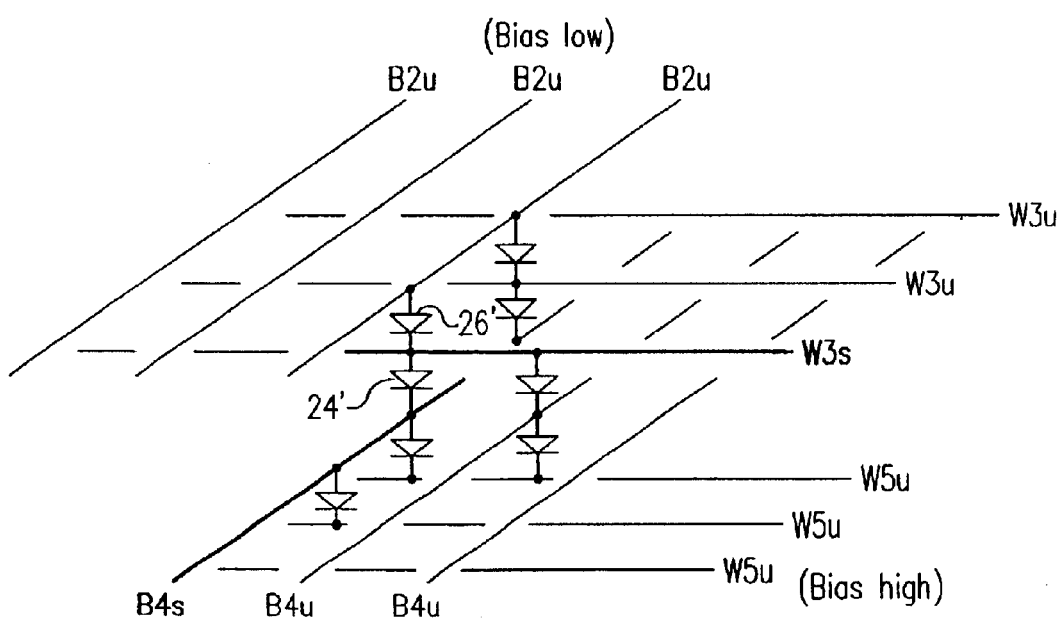
FIG. 4 is a three-dimensional electrical schematic diagram illustrating reversed bias diode leakage in a serial chain diode stack-type memory array in accordance with one specific embodiment of the present invention.

A section of a serial chain diode stack memory is illustrated in FIG. 4. As in FIG. 2, the same memory cell 24' at the intersection of word line W3s and bit line B4s is selected. This is accomplished by raising the voltage on W3s and lowering the voltage on B4s for both a read and a write. The unselected memory cells in the plane W3-B4 are reverse-biased, as in FIG. 2. However, the adjacent planes need not be reverse-biased. By keeping the B2u bit lines at the same potential as the W3u word lines (i.e., low) and keeping the W5u word lines at the same potential as the B4u bit lines (i.e., high), the approximately $N^2$ unselected memory cells in these arrays do not have a forward or reverse bias (although the "half-selected" memory cells connected to either the selected word line or bit line are biased). Hence, with this scheme, only approximately $N^2$ memory cells are reverse-biased for reads or writes. This factor of three reduction in leakage current can be exploited by making a larger array for a given leakage, which, in turn, results in an overall semiconductor die size reduction. Alternatively, for a given leakage specification, the write bandwidth can be increased since multiple arrays can be powered up at the same time with the reduced leakage.

Figure 5:
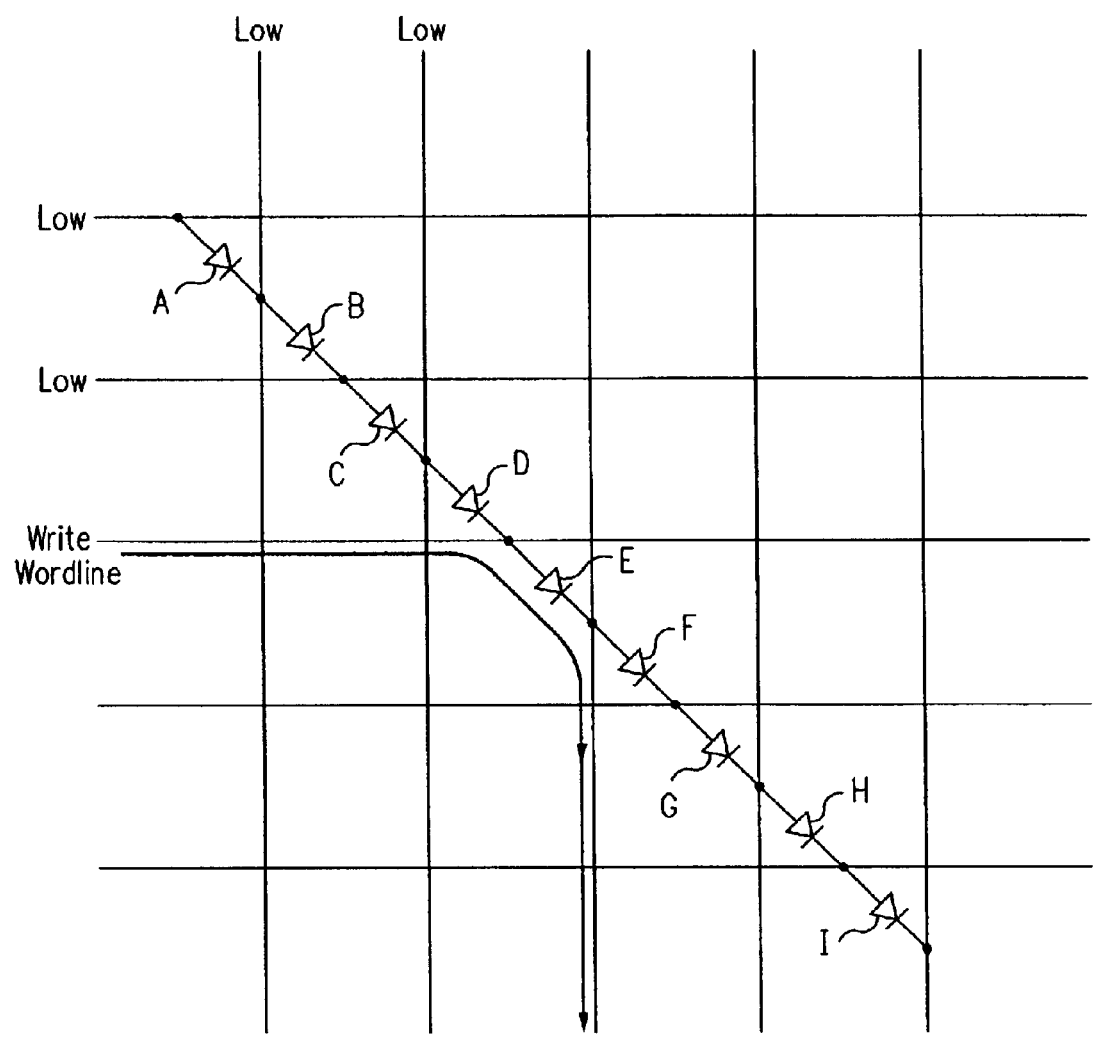
FIG. 5 is an electrical schematic diagram illustrating the programming of diode E in a serial chain diode stack-type memory array in accordance with a specific embodiment of the present invention.
Figure 6:
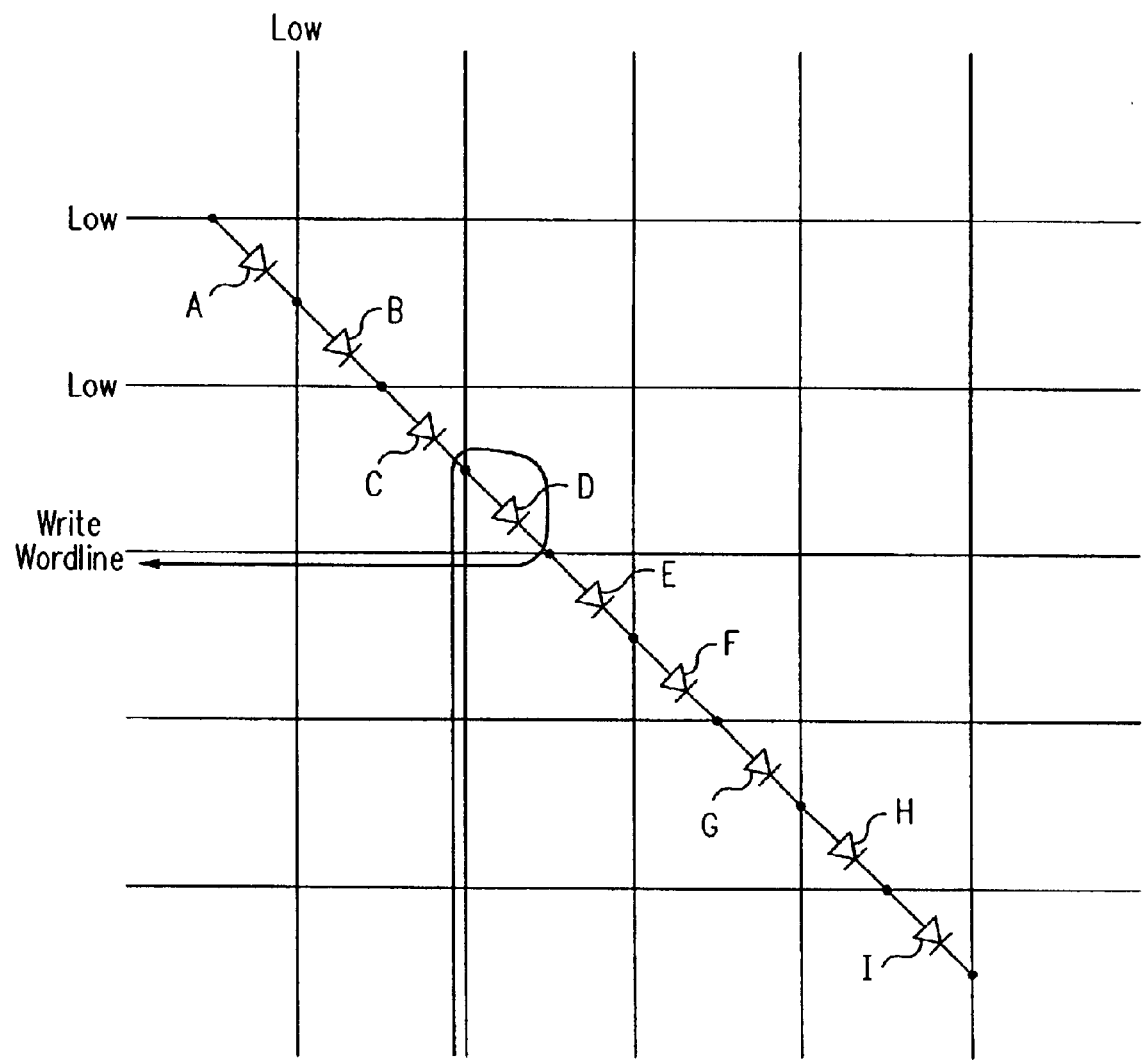
FIG. 6 is an electrical schematic diagram illustrating the programming of diode D in a serial chain diode stack-type memory array in accordance with a specific embodiment of the present invention.

A drawback of this approach is that it requires high-voltage drivers on both the row and column sides of the array that can pass a write current in both directions depending on the selected diode (see FIGS. 5 and 6 where diodes E and D, respectively, of the same word line, are written). Similarly for reads, a column (bit) must be able to detect both a positive and a negative current due to a programmed state change element. The complexity and area increases are much smaller than the potential savings from a 3× to 4× increase in array size, resulting in an overall advantage to employing this scheme.

Figure 7A:
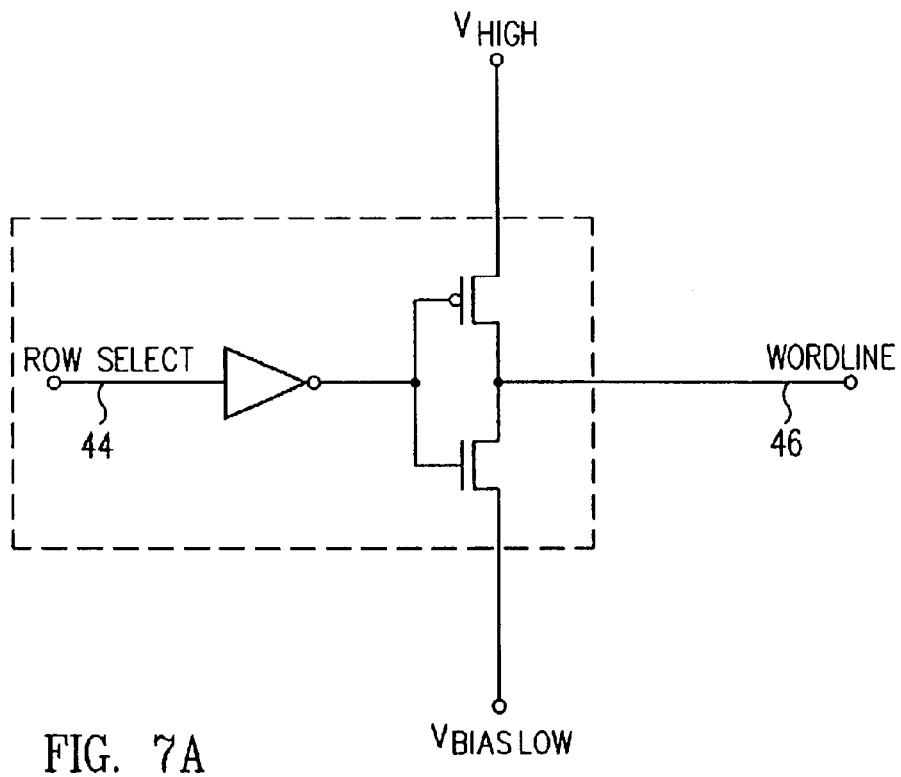
FIG. 7A is an electrical schematic diagram of a row address circuit in accordance with a specific embodiment of the present invention.
Figure 7B:
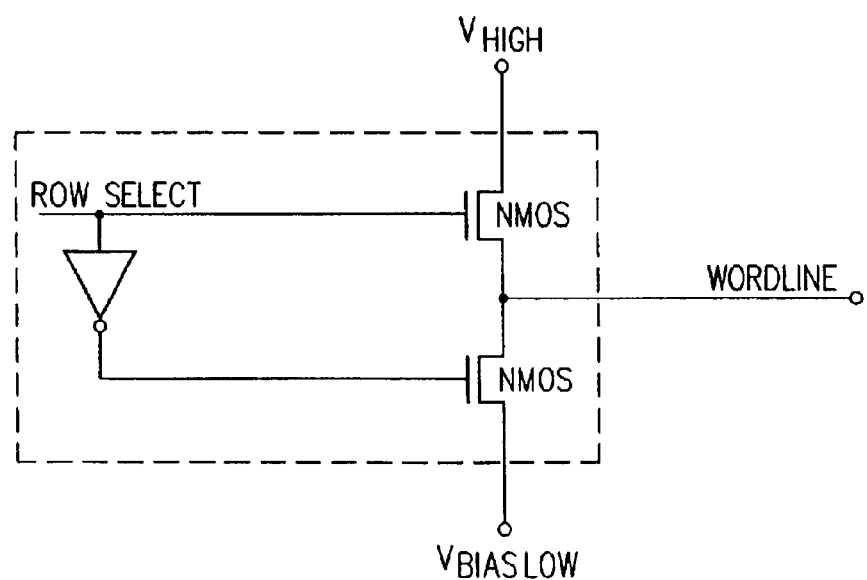
FIG. 7B is an electrical schematic diagram of a row address circuit in accordance with a specific embodiment of the present invention.
Figure 7C:
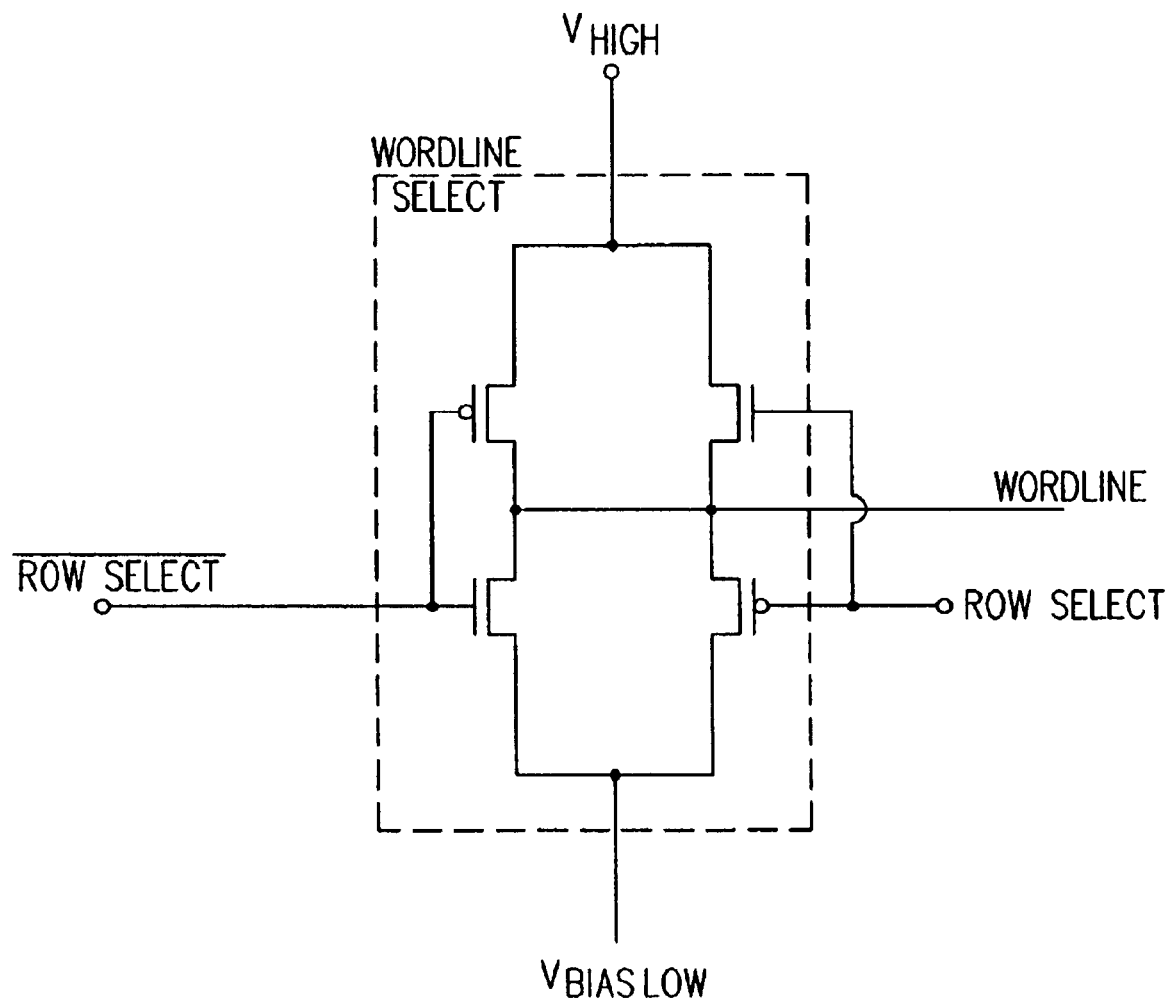
FIG. 7C is an electrical schematic diagram of a row address circuit in accordance with a specific embodiment of the present invention.

A row address circuit suitable for the back-to-back diode stack of FIG. 2 is illustrated schematically in FIG. 7A. A conventional row decoder (not shown) decodes one of N word lines. A row driver stage of this decoder with the row select signal on line 44 is shown in FIG. 7A. If Row select is high, the selected word line 46 is driven to Vhigh in order to read or write one or several cells connected to the selected word line 46. If Row select is low (unselected word line), the voltage on word line 46 is driven to a low bias voltage, Vbiaslow, in order not to interfere with the programming or reading along the selected bit line. ($V_{HIGH}$ and $V_{BIASLOW}$ preferably have different values in read mode than in write mode.) Another row address circuit suitable for the back-to-back diode stack is shown in FIG. 7B. This circuit uses only NMOS transistors, so the positive bias of Row select drives the word line high to select the word line. A negative bias on the RowSelect drives the word line low when unselected. Yet another word line driver circuit is shown in FIG. 7C, which receives a true and complement row decode signal ROWSELECT, and is capable of driving a selected word line to the $V_{HIGH}$ voltage even for values of $V_{HIGH}$ at or near ground. Similarly, an unselected word line is driven to the $V_{BIASLOW}$ voltage, even if well above ground. This avoids the loss of an NMOS threshold voltage on an unselected word line for certain bias conditions, as described further below. Alternatively, in the FIG. 7B circuit, a bootstrapped gate voltage or a higher gate voltage, such as from a charge pump circuit, could be used to avoid the loss of a threshold voltage. The bit line selection system (not shown) works essentially the same with the selected bit line being driven low and the unselected bit lines being driven high. Other suitable row decoder/driver circuits are described in "A 15 ns 1024-bit Fully Static MOS RAM," by T. Wada, et. al., IEEE Journal of Solid-State Circuits, Vol. SC-13, No. 5, October 1978, and in "A Fault-Tolerant 30 ns/375 mW 16K×1 NMOS Static RAM," by K. C. Hardee, et. al., IEEE Journal of Solid-State Circuits, Vol. SC-16, No. 5, October 1981, both of which are hereby incorporated by reference.

In the FIG. 2 array, a word line corresponding to a selected cell (e.g., 24 or 28) is always driven high. In the FIG. 4 embodiment, however, because the current steering elements are all directed in the same direction relative to the substrate, the word line corresponding to a selected cell (e.g., W3s) is driven high if the cell 24' below the word line W3s is to be programmed or read, however, it is driven low if the cell 26' above the word line (W3s) is to be programmed or read.

Figure 8:
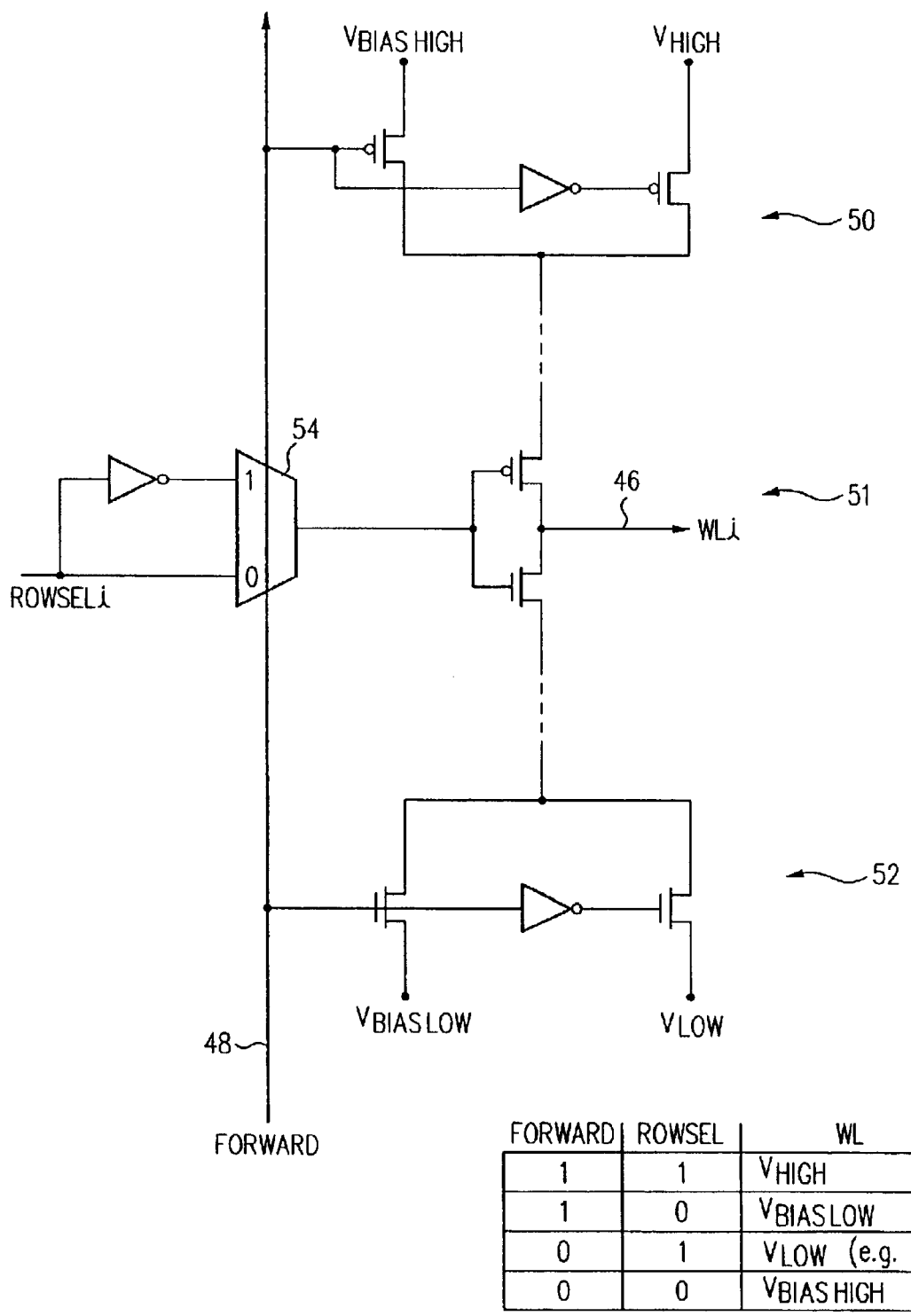
FIG. 8 is an electrical schematic diagram of a control circuit for a serial chain diode stack-type memory array in accordance with one specific embodiment of the present invention.

In order to drive the selected word line 46 both high and low for the serial chain diode stack illustrated in FIG. 4, the driver circuit of FIG. 7A can be modified to that shown in FIG. 8. (Either word line driver circuit shown in FIG. 7A and FIG. 7B may be used, but only the circuit of FIG. 7A is shown in FIG. 8.) The FORWARD signal on line 48 will be set to forward bias the selected cell, whether the word line 46 connects to the cell above or below the word line. When the selected word line is to be driven high, and FORWARD is high, the word line is connected to Vhigh, and the unselected word lines are connected to Vbiaslow, as is the case in FIG. 8. However, when the selected word line is to be driven low, the word line is connected to Vlow, and the unselected word lines are connected to Vbiashigh. The new 'high-plane' 50 and 'low-plane' 52 cells as well as the row select mux 54 are therefore additional circuits that are required by the serial chain diode stack.

Figure 9:
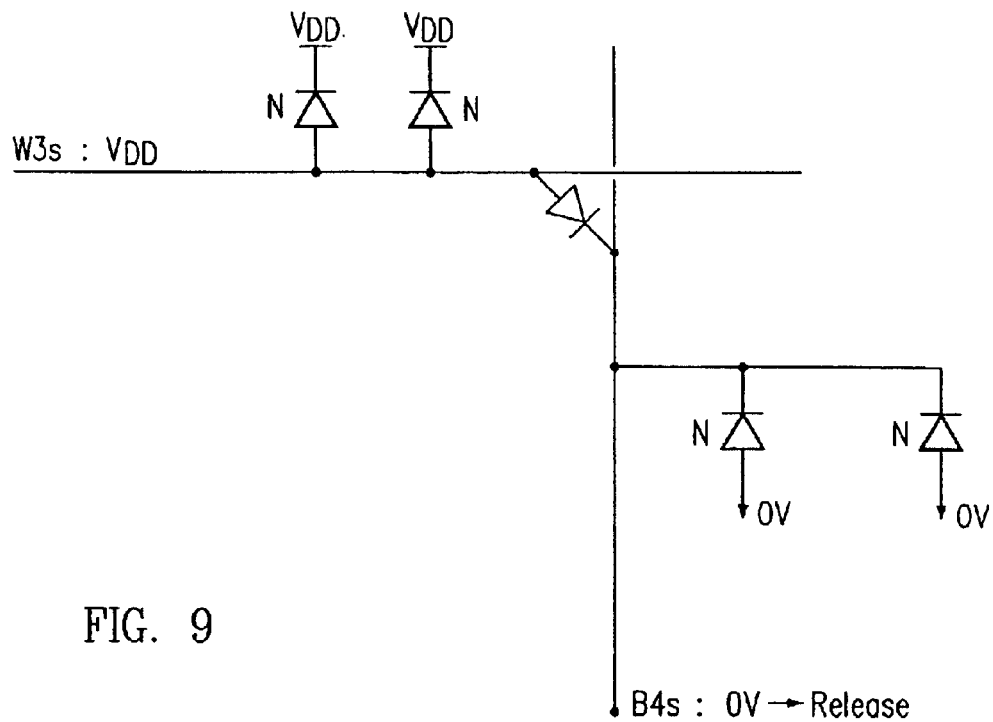
FIG. 9 is an electrical schematic diagram illustrating reverse bias diode leakage during read in a back-to-back diode stack-type memory array.
Figure 10:
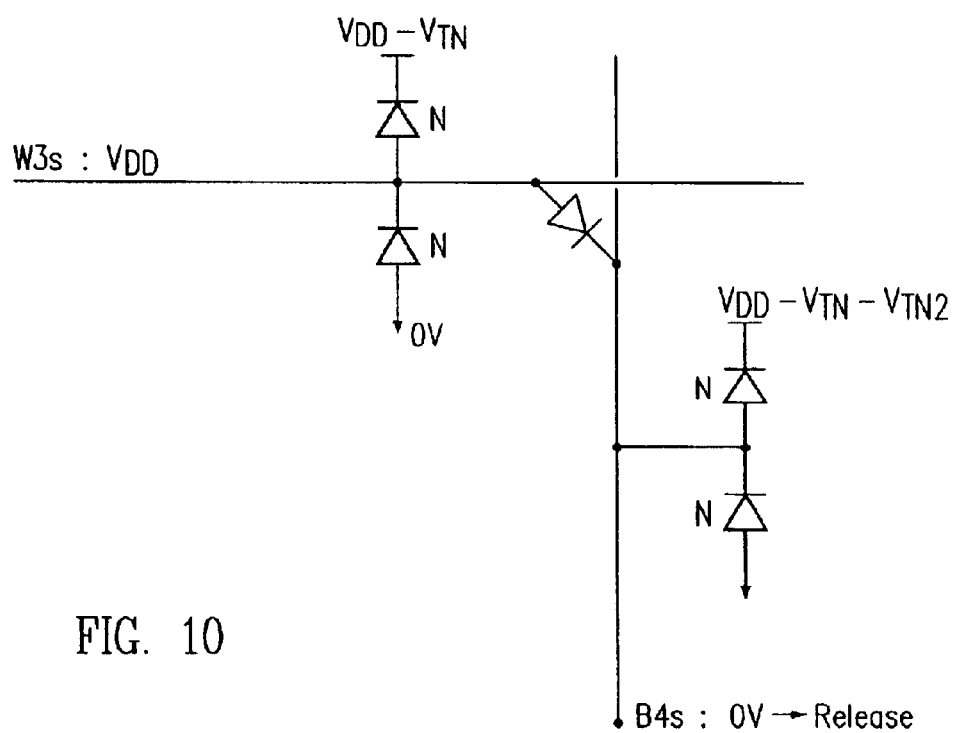
FIG. 10 is an electrical schematic diagram illustrating reverse-bias diode leakage during read in a serial chain diode stack-type memory array in accordance with one specific embodiment of the present invention.

The leakage path is different for reads. The total leakage of the serial chain diode stack approach for reads is about ⅓ of the back-to-back diode stack approach due to the requirement that only one plane of diodes be reverse-biased in the serial chain diode stack approach. This reduces the reverse stressing during read disturb as well as the total power consumption. The leakage constraint is also different as illustrated schematically in FIG. 9 (back-to-back diode stack) and FIG. 10 (serial chain diode stack). The back-to-back diode stack approach illustrated in FIG. 9 raises a selected word line (W3s) to Vdd and pulls a selected bit line (B4s) low and subsequently releases it, allowing the selected diode to pull it up. If the antifuse is not programmed, the bit line will remain floating at a low voltage level, whereas if the antifuse is programmed, the bit line will rise. The difference in voltage can be used to sense if the cell is programmed or not.

The leakage of 2N reverse-biased diodes to ground will increase as the voltage increases. If the reverse leakage is comparable to the selected forward cell current, the voltage developed at the bit line will be self limited. For the serial chain diode stack approach illustrated in FIG. 10, the leakage is both to ground and to a bias voltage supply. By biasing the adjacent diode planes as shown, the same read scheme may be employed. $V_{TN}$ is the diode drop of N diodes (typically about 1 volt), while $V_{TN2}$ is the diode drop of $N^2$ diodes (about 0.5 volts). Thus, for a read voltage of 2 volts at W3s, and B4s precharged to ground, the leakage from the bit line (B4s) to the unselected plane biased at ($V_{DD}-V_{TN}-V_{TN2}$=0.5V) through N diodes is the reverse leakage of 0.5 volts at the beginning of the read, reducing to approximately zero at the end of the read. Only N diodes leak to ground at the end of the read vs. 2N diodes leaking to ground with the back-to-back approach. Hence, a higher voltage can be developed, which can enable a higher noise margin.

This approach to reading memory elements may be used with any memory stack element such as multi-programmable memory elements and is not limited to diode-type memories.

Figure 11:
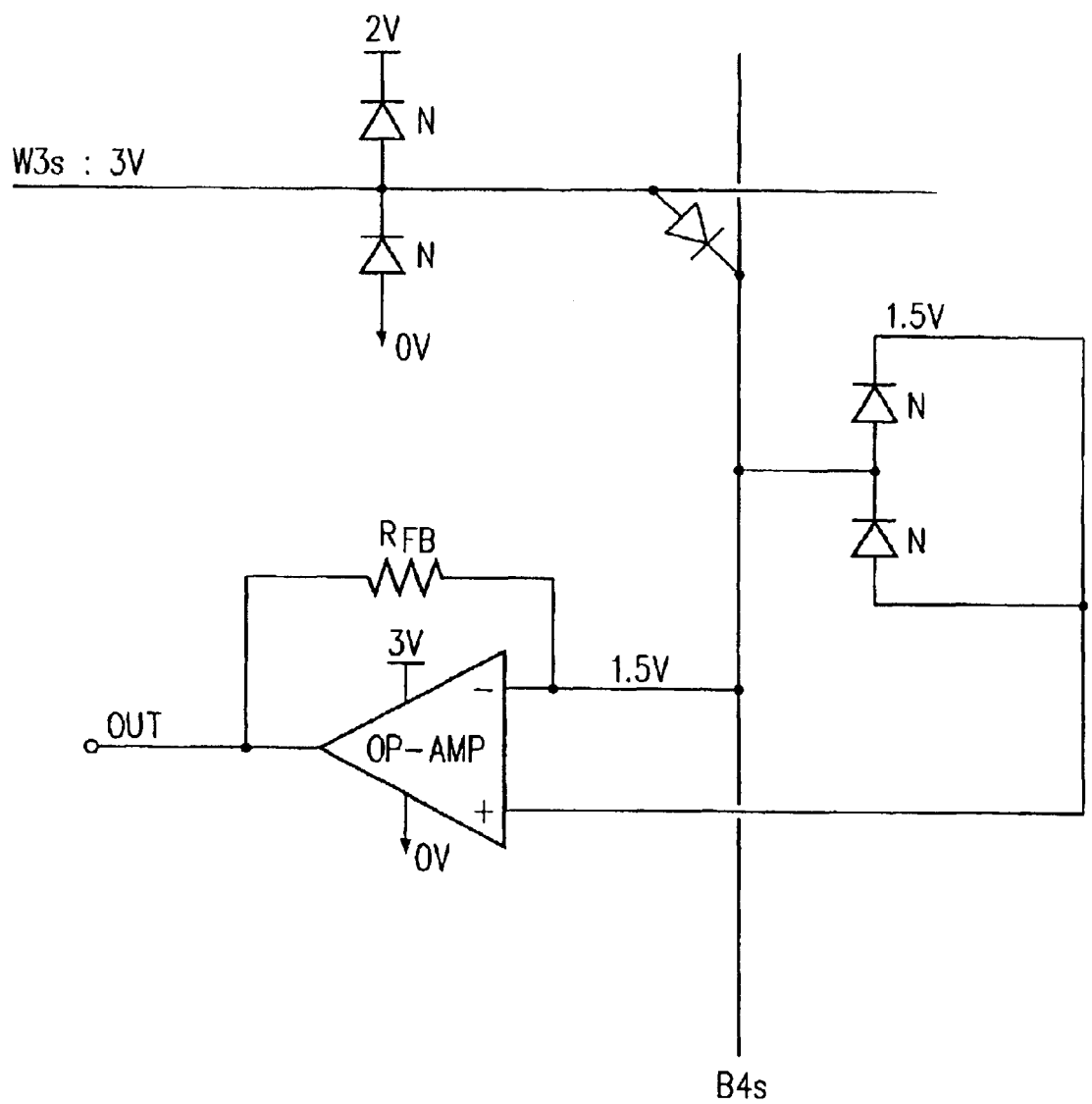
FIG. 11 is an electrical schematic diagram of a sensing circuit for reading a serial chain diode stack-type memory array in accordance with a specific embodiment of the present invention.

An additional approach is to apply the same voltage at planes 3 and 5 (unselected word lines) as well as to the selected bit line, eliminating the selected bit line leakage as illustrated schematically in FIG. 11. The voltage forced is 1.5 volts below the selected word line. The selected word line shown in FIG. 11 is at 3 volts. The sensing of the diode can be done by current sensing, leaving the bit line at the same bias as that of planes 3 and 5, achieving a fast read. As illustrated in FIG. 11, this biasing scheme allows a simple implementation of an op-amp with a virtual ground at about one-half VDD. Additional current sensing embodiments are set forth in "Current Sensing Method and Apparatus Particularly Useful for a Memory Array of Cells Having Diode-Like Characteristics," by Roy E. Scheuerlein, U.S. patent application No. 09/896,468, filed Jun. 29, 2001, and is hereby incorporated by reference.

Figure 12:
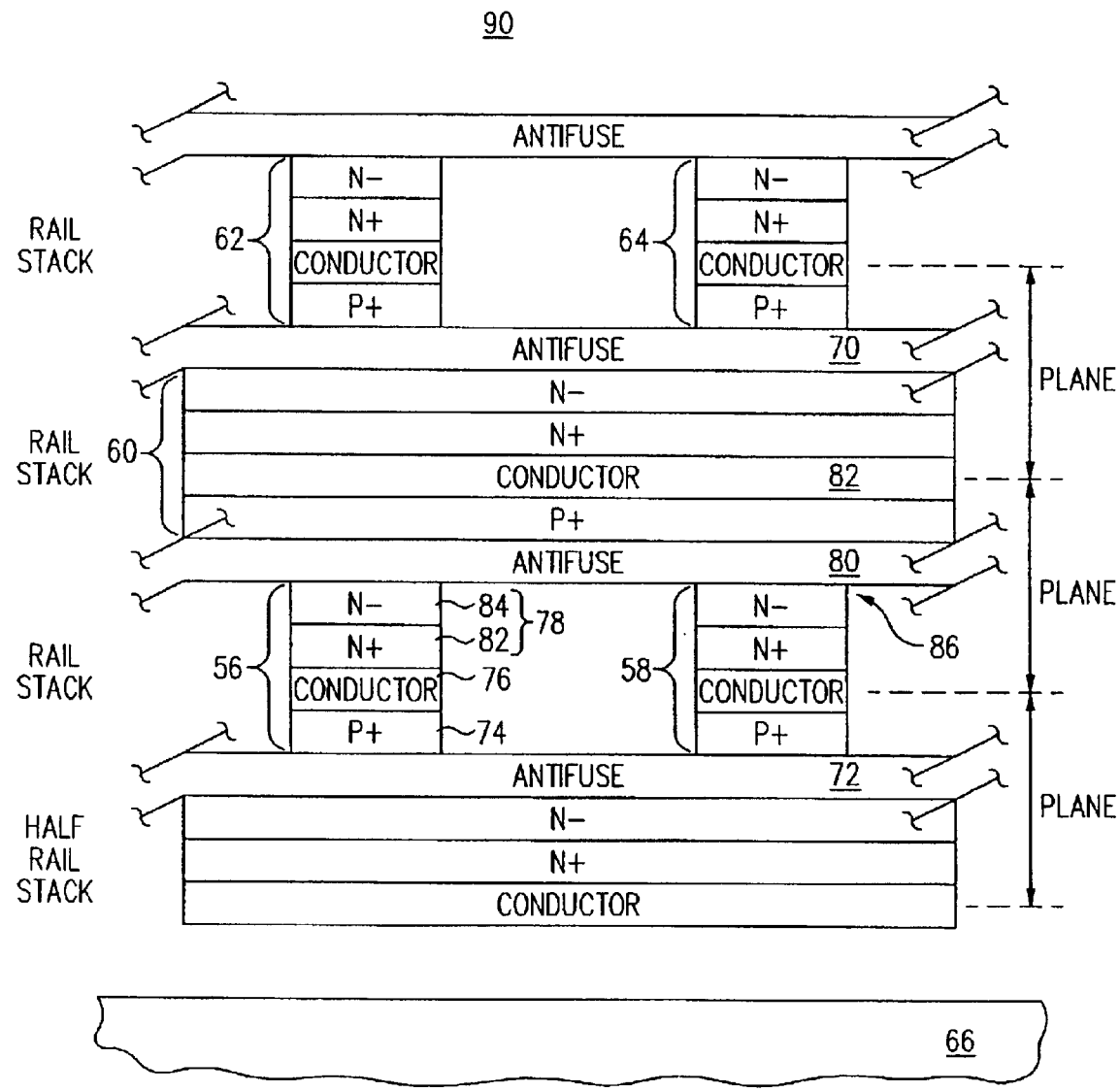
FIG. 12 is a front elevational cross-sectional diagram of a serial chain diode stack-type memory array in accordance with one embodiment of the present invention.

Turning now to FIG. 12, a specific embodiment of the serial chain diode stack approach is illustrated in accordance with the present invention. In the FIG. 12 embodiment, the first rail stacks and the second rail stacks may be essentially identical and include a conductor sandwiched by semiconductor films disposed over/under and along the length of the conductor. The semiconductor film may comprise two or more layers or it may comprise a graded doped layer, illustrated in FIG. 12 as an N+ layer having an N- layer disposed over and along it. An antifuse material layer is disposed over the semiconductor film. A P+ layer is disposed above the antifuse layer so that cells are formed of p+/AF/n- structures so that when the antifuse (AF) is programmed to conduct, a p+n- diode is formed. The rail stacks may be replicated in layers oriented orthogonally to vertically adjacent (above or below) layers. The identical rail stacks ease the fabrication process. Programming voltages are delivered by the conductor layers, as before.

Figure 13:
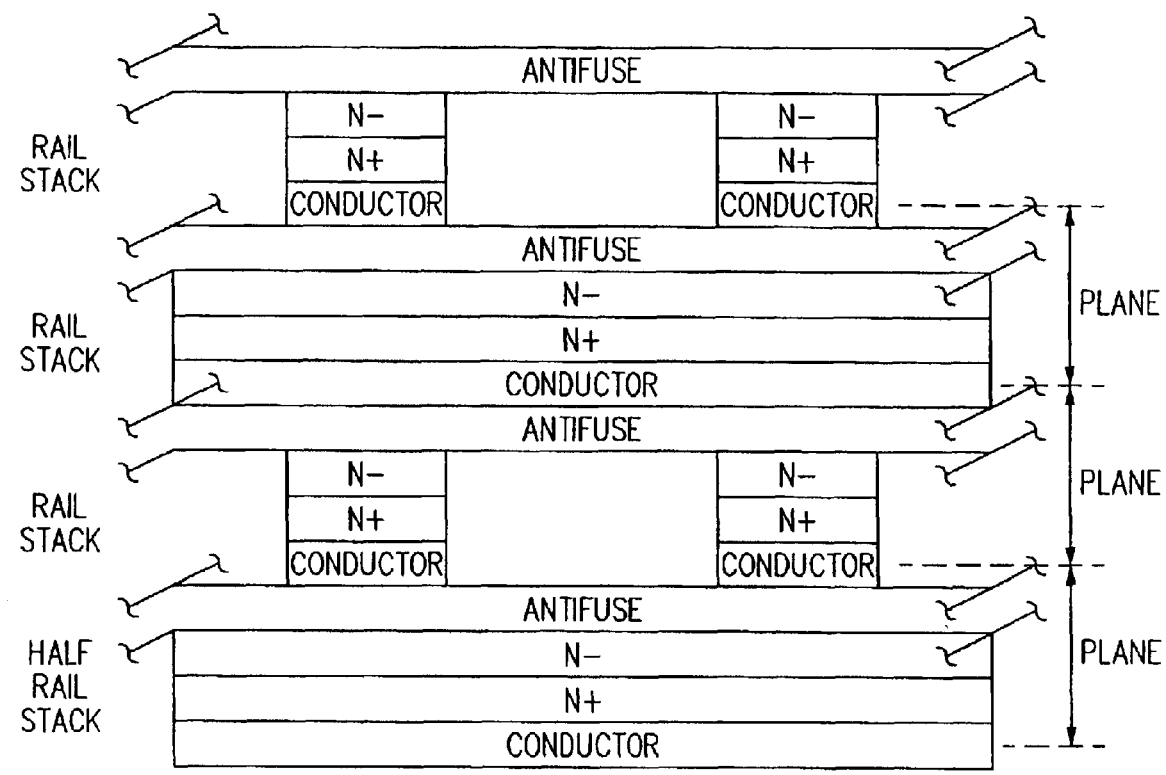
FIG. 13 is a front elevational cross-sectional diagram of a serial chain diode stack-type memory array in accordance with another embodiment of the present invention.

Turning now to FIG. 13, another specific embodiment of the serial chain diode stack approach is illustrated in accordance with the present invention. In the FIG. 13 embodiment, the first rail stacks and the second rail stacks may likewise be essentially identical and include a conductor and a semiconductor film disposed over and along the conductor. The semiconductor film may comprise two or more layers or it may comprise a graded doped layer, illustrated in FIG. 13 as an N+ layer having an N- layer disposed over and along it. An antifuse material layer is blanket disposed over the semiconductor film. The rail stacks may be replicated in layers oriented orthogonally to vertically adjacent (above or below) layers. The identical rail stacks ease the fabrication process. Programming voltages are delivered by the conductor layers, as before. The diodes formed in this embodiment are of the Schottky type.

The structures of FIGS. 12 and 13 are one-time field programmable three-dimensional memories preferably built out of repeating rail stacks separated by blanket depositions of antifuse material onto a planarized surface. The same rail stacks are used in both directions to build the three dimensional memory. In the following description, numerous specific details are set forth such as specific materials and layer thicknesses. It will be apparent, however, to those of ordinary skill in the art that the present invention may be practiced without these details. In other instances, well-known circuits and fabrication techniques have not been set forth in detail in order not to unnecessarily obscure the present invention.

A preferred memory array is fabricated on several levels and, for instance, may have eight levels of storage. Each level includes a first plurality of parallel spaced-apart rail-stacks running in a first direction and a second plurality of rail-stacks running in a second direction. A rail-stack may be shared by two levels of storage. Thus, eight planes of memory cells may be provided by nine levels of rail-stacks. Generally, the first rail-stacks run perpendicular to the second rail-stacks and hence form a right angle at their intersections. This allows the structure to be self-aligned. A bit is stored at each of the intersections of rail-stacks. However, there is no apparent individual memory cell at the intersections, rather memory cells are defined by the rail-stacks and intermediate layers. When the array is fabricated all the bits are in the zero (or one) state and after programming, the programmed bits are in the one (or zero) state.

In the embodiment of FIG. 12, several rail-stacks are illustrated in the partial cross-section of the invented array. For instance, rail-stacks 56 and 58 are shown at one height (above the substrate 66 which may contain various driver circuits) and rail stack 60 is shown at a second height above the first height and is disposed in a different direction from rail stacks 56 and 58 (and is preferably perpendicular to them). Rail stacks 62 and 64 are disposed in a similar direction to rail stacks 56 and 58 and are disposed over railstack 60.

The array is fabricated on a substrate 66 which may be an ordinary monocrystaline silicon substrate. Decoding circuitry, sensing circuits, and programming circuits are fabricated in one embodiment within the substrate 66 under the memory array using, for instance, ordinary MOS fabrication techniques. These circuits may also be fabricated above the substrate. Vias are used to connect conductors within the rail-stacks to the substrate to allow access to each rail-stack in order to program data into the array and to read data from the array. For instance, the circuitry within the substrate 66 may select rail-stack 56 and the rail stack 60 in order to either program or read a bit associated with the memory cell formed by the intersection of these respective rail-stacks.

An insulating layer is formed over the substrate 66 in order that the array may be fabricated above the substrate. This layer may be planarized with, for instance, chemical-mechanical polishing (CMP) to provide a flat surface upon which the array may be fabricated.

Structure 90 shown in FIG. 12 comprises three entire rail stacks of a potentially much larger structure. In forming structure 90, a blanket deposition of an antifuse material layer 72 is made and planarized (shown here over a previously formed structure using techniques described herein). Alternatively, a blanket deposition of the antifuse material layer 72 may be first made on other underlying structures without requiring planarization. Over that, a p+ layer 74 is deposited. Following this, a conductive layer 76 is formed on the p+ layer 74. As will be seen, conductive layers are used within the rail-stacks and these layers and the resultant conductors may be fabricated from elemental metals such as tungsten (W), tantalum (Ta), aluminum (Al), copper (Cu) or metal alloys may be used such as molybdenum-tungsten (MoW). Metal silicides may also be used such as titanium silicide (TiSi$_2$), cobalt silicide (COSi$_2$) or a conductive compound such as titanium nitride (TiN) or tungsten carbide (WC) may be used. A heavily doped semiconductor layer such as silicon (Si) is also suitable. Multiple layer structures may be used selecting one or more of the above.

Following the deposition of a conductive layer 76, a layer of semiconductor material 78 such as silicon is formed over the conductive layer 76. This is typically a polysilicon layer; however, an amorphous silicon layer may be used. Other semiconductor materials may be used such as germanium (Ge), gallium arsenide (GaAs), etc. In the embodiment of FIG. 12 this semiconductor layer is heavily doped with a dopant of the first conductivity type and, as will be seen, forms one-half of a diode.

The structure is then masked and etched to form rail stacks. The resulting spaces between the rail-stacks are filled with a dielectric such as silicon dioxide. Then the rail-stacks and dielectric fill are planarized, such as by chemical mechanical polishing (CMP). In another embodiment spin-on-glass (SOG) is used to fill the voids. In this case chemical planarization can be used such as, for example, plasma etching. Other fill and planarization methods can be used.

Following this, in the embodiment of FIG. 12, an antifuse material layer used to program the array is blanket deposited shown as layer 80. In one embodiment, the antifuse material layer 80 is a dielectric such as silicon dioxide (SiO$_2$) that is deposited by chemical vapor deposition (CVD) in a blanket deposition over the semiconductor material layer 78. In another embodiment the antifuse material layer 80 may be grown on the upper surface of the semiconductor material layer 78 and only exists on the rail-stacks. Other materials known to those of ordinary skill in the art as antifuse materials can be used such as, for example, silicon dioxide, silicon nitride, silicon oxynitride, ONO (a 3-ply layer of oxide, nitride and oxide), amorphous carbon or other insulating materials or combinations of materials. (Also an undoped layer of silicon such as amorphous silicon may be used for the antifuse layer.)

This process is now repeated as many times as desired to form a repeating structure of intersecting, preferably identical, rail stacks.

Semiconductor material layer 78 may include more than one layer (e.g., n+ layer 82 and n− layer 84) with the layer farthest from the conductor 76 being more lightly doped than the layer closest to the conductor 68. Alternatively, it may be a graded single layer 78 achieved through, for example, implantation.

It should be noted that n+ and p+ layers preferably sandwich the conductor layers. These heavily doped layers provide ohmic transitions to prevent unintended Schottky diode formation.

It should be noted that the silicon layers 78 disposed on the conductive layers 76 extend the entire length of the rail-stacks in the embodiment of FIG. 12 and are uninterrupted except possibly where vias are used to provide a conductive path to the substrate 66.

For instance, to program the bit, a relatively high write voltage, 5–20V is applied between the conductors (e.g., between conductors 76 and 82). This relatively high voltage causes a breach in the antifuse material layer 72, 80 creating a diode. Without this high voltage, the layer 72, 80 remains an insulator. Thus, by selecting pairs of conductors, diodes can be selectively formed so as to program the array. It is currently preferred that the write voltage be applied with a polarity such that the more positive voltage is applied to the rail-stack that constitutes the anode of the diode that is created by the breach of layer 72, 80. It is also possible to program using a reverse-biasing potential or an alternating current (AC) signal as is well known to those of ordinary skill in the art.

To sense the data programmed into the array, a voltage lower than that for programming is used. This voltage is applied so as to forward-bias the diode of the cell being accessed and allow a sense amplifier to determine whether or not the antifuse material layer 72, 80 is intact between the rail-stacks. Note that "sneak" or parasitic paths in the array which would interfere with the sensing will include a reverse-biased diode.

Typically the following parameters may be used in the fabrication of the device of FIG. 12: Antifuse material layer thickness 5–200 Å of silicon dioxide, which can be deposited with any one of very well-known processes; N− layers: a silicon layer is deposited which is typically 1000–4000 Å thick and formed with a CVD process where a phosphorous dopant is deposited along with the deposition of for instance, the polysilicon semiconductor material or where the dopant is ion implanted following the deposition of the layer. This layer is doped to a level of, for example, $1\times10^{17}/cm^3$, but can be doped to a level in a range from $1\times10^{15}/cm^3$ to $1\times10^{19}/cm^3$; N+ layers: using CVD this layer may be approximately 300–3000 Å thick and in one embodiment is doped to a level of $>10^{19}/cm^3$.

Throughout this application two adjacent silicon layers are often shown such as layers 52 and 53, with different doping. These layers may be formed with one deposition and using ion implantation steps at two different energy levels to obtain the two doping levels. Also, these differently doped layers may be formed by introducing different amounts of dopant in a diffusion process as a layer is formed.

A conductive layer which may be 500–1500 Å thick is formed using any one of numerous well-known thin film deposition process such as sputtering. A refractory metal may be used or a silicide of a refractory metal. Also as mentioned aluminum or copper can be used, or more simply the heavily doped silicon can be the conductor. In one embodiment, titanium (Ti) and TiN layers are formed on the silicon (Si) layer and the wafer is heated to form a silicide. For instance, a Ti layer of 250 Å and a TiN layer of 70 Å are heated at 600° C. for one minute to form the silicide.

To form preferred P+ layers, a polysilicon layer approximately 1500–2000 Å thick is formed doped to a level of $>10^{19}/cm^3$.

A masking and etching step is used to define rail-stacks. An ordinary masking and etching step for instance using plasma etching, may be used. Etchants can be used that stop on the antifuse layer thus preventing this layer from being etched away. Thus, the antifuse material layers can be considered an etchant stop layer depending on the specific etchants used.

The spaces between the rail-stacks are filled with a dielectric such as one formed with a HDPCVD (high density plasma chemical vapor deposition) process.

Chemical-mechanical polishing is then employed to planarize the upper surface of the rail-stacks. Chemical etching can also be used as mentioned with certain dielectrics. This planarization can reduce the thickness of the layer as desired.

Antifuse layer 80 is formed on the planarized surface 86. Since the layer 80 is deposited over all the rail-stacks and the filler material and remains unetched (and in some embodiments may not be planarized), it forms a barrier to the migration of the materials subsequently deposited that might make their way along the sides of the rail-stacks. Thus the layer 80 helps prevent the parasitic paths and potential shorts that may occur with prior art memories.

It should be noted that in FIG. 12 while the antifuse layer is shown as a blanket layer covering the rail-stacks and fill, it is possible also to fabricate each level where the antifuse layer is in fact grown from a semiconductor layer. For instance, an oxidation step may be used to grow a silicon dioxide layer.

In all the embodiments, the rail-stacks and rails are connected to circuitry in the substrate such as decoders, sense amps and like peripheral circuits. Vias for providing these connections are described in co-pending application Ser. No. 09/746,341, entitled "Contact and Via Structure and Method of Fabrication," hereby incorporated by reference.

Turning now to FIG. 13, this embodiment differs from that of FIG. 12 in that the P+ layers are eliminated allowing the forming of Schottky diodes between N− doped silicon, through the AF and directly to the conductor. Since programming in this array causes the formation of Schottky diodes, the conductors must be of a suitable material to allow formation of a Schottky diode. For instance, aluminum and some refractory metal or suicides may be used.

Figure 14:
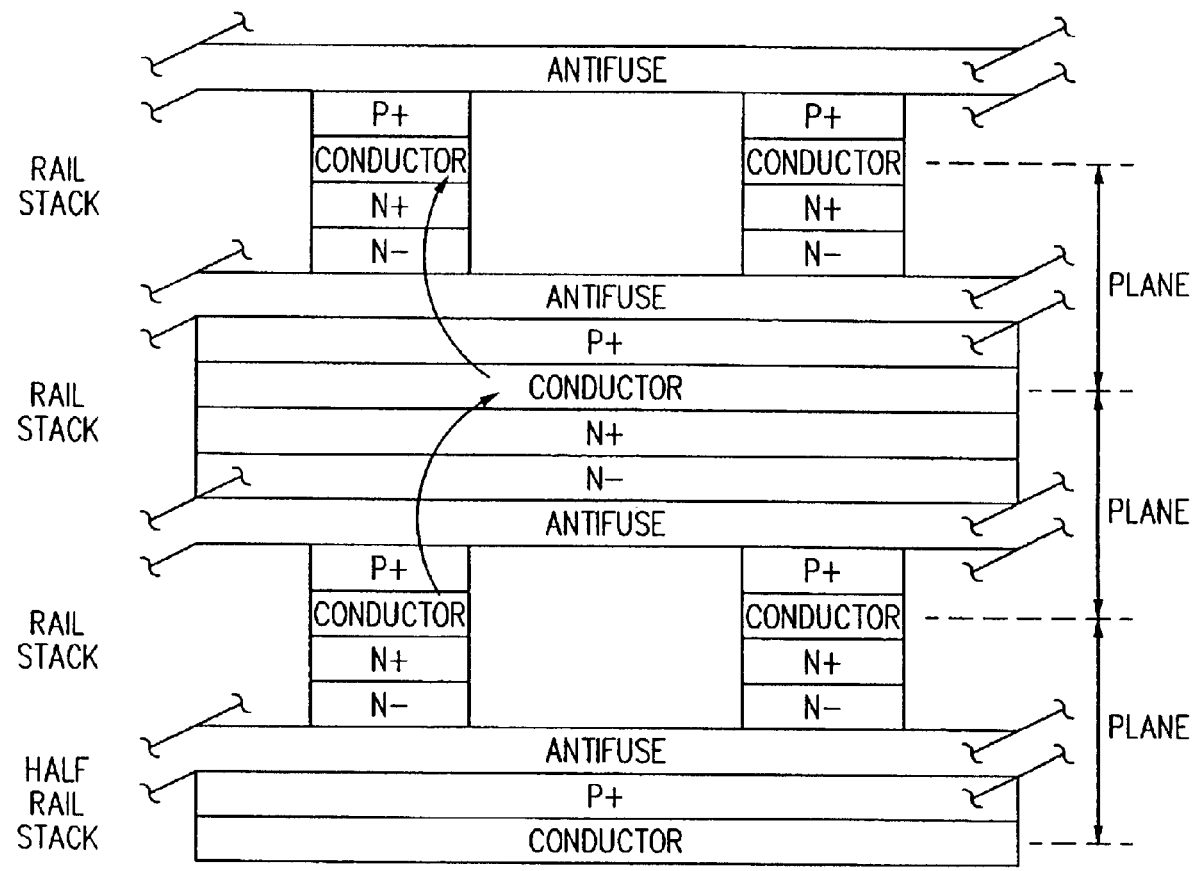
FIG. 14 is a front elevational cross-sectional diagram of a serial chain diode stack-type memory array in accordance with another embodiment of the present invention.
Figure 15:
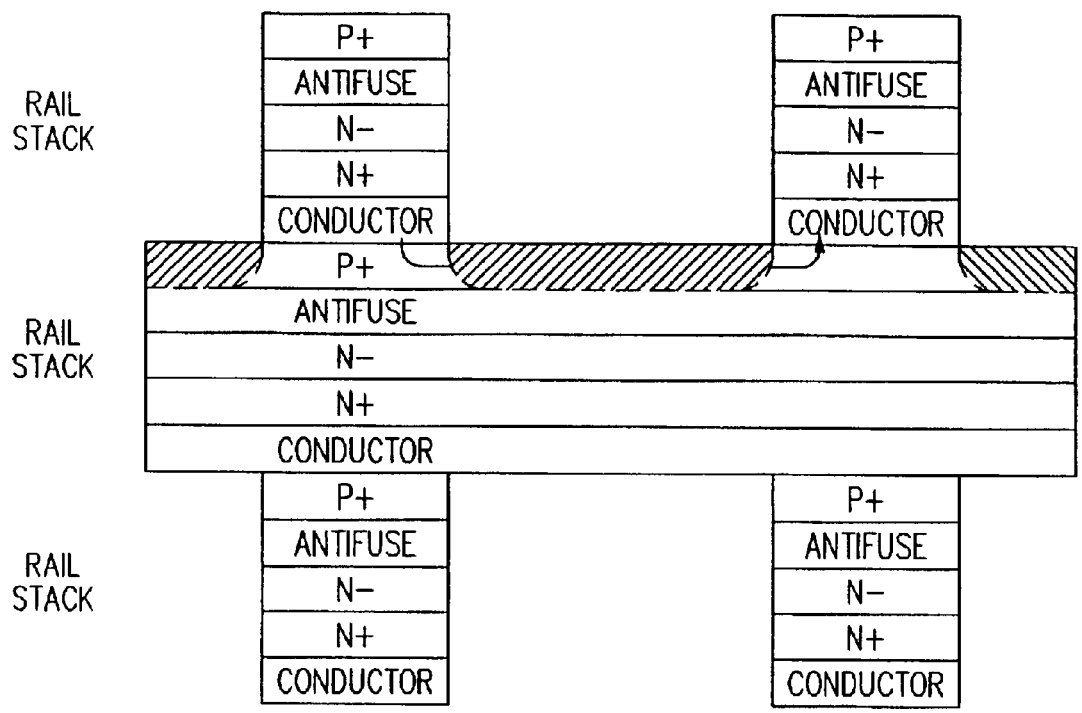
FIG. 15 is a front elevational cross-sectional diagram of a serial chain diode stack-type memory array in accordance with another embodiment of the present invention.
Figure 16:
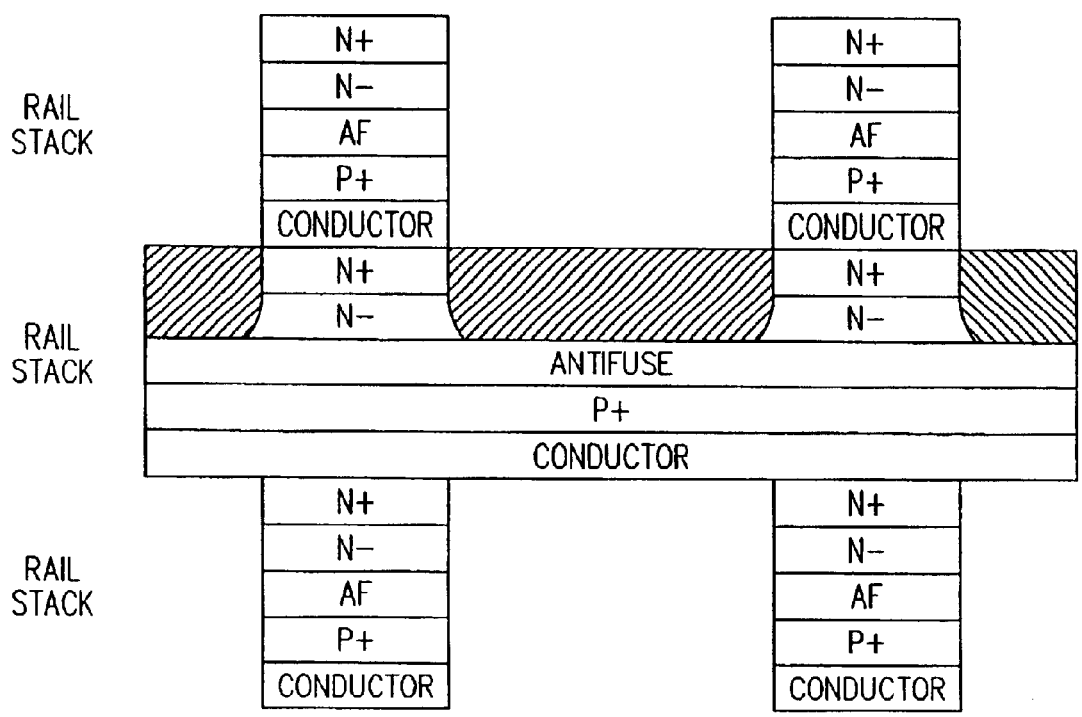
FIG. 16 is a front elevational cross-sectional diagram of a serial chain diode stack-type memory array in accordance with another embodiment of the present invention.

Generally the layers of the serial chain diode stacks of FIGS. 12 and 13 are formed in the same manner described at length above. Note that these structures can be oriented as shown, or completely inverted from FIGS. 12 and 13. For example, FIG. 14 depicts a structure completely inverted from that shown in FIG. 12, and which provides for forming a lightly-doped N− layer onto a highly planar antifuse layer, providing better control of diode characteristics. The rail-stack structure shown in FIG. 15 includes a conductor layer at the bottom of each rail-stack. The rail-stack structure shown in FIG. 16 also includes a conductor layer at the bottom of each rail-stack, but inverts the order of the semiconductor and antifuse layers forming the remainder of each rail-stack. These represent several of the many suitable rail-stack embodiments useful for the present invention.

Figure 17:
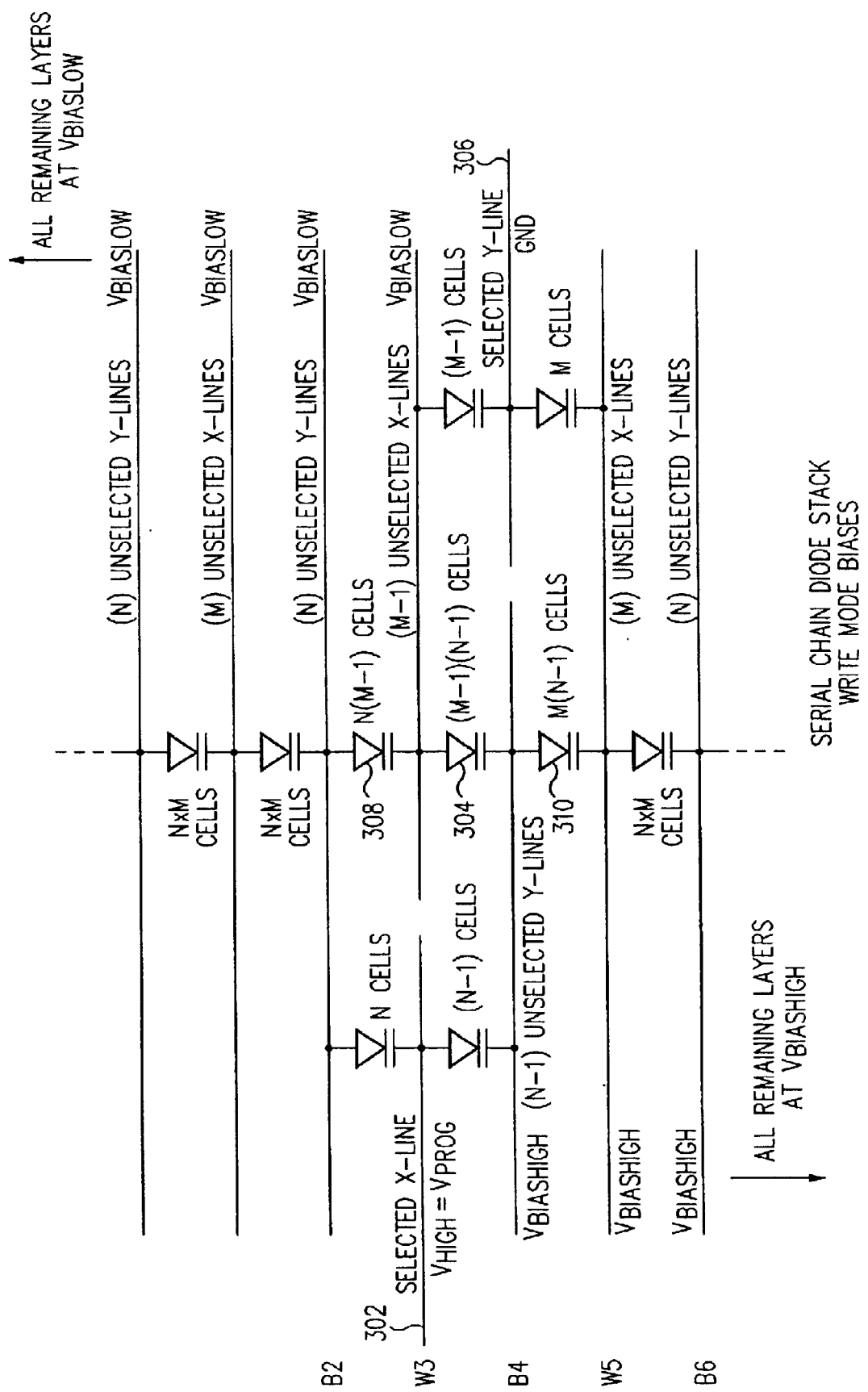
FIG. 17 is a schematic diagram representing a serial chain diode stack-type memory array and indicating a write bias arrangement of array lines on various layers, in accordance with an embodiment of the present invention.

Referring now to FIG. 17, a simplified schematic diagram is shown representing preferred bias conditions in a multi-level serial chain diode stack during a write mode. A selected X-line 302 on the W3 level is driven to a $V_{HIGH}$ voltage (e.g., equal to $V_{PROG}$) and a selected Y-line 306 on the B4 level is driven to ground to program a selected memory cell in the W3-B4 memory plane (not shown). With the bias voltages as shown, only the unselected memory cells 304 (numbering approximately $N^2$) are reversed-biased during the write operation with a voltage that approaches the programming voltage $V_{PROG}$ in magnitude. In particular, unselected memory cells 308 and 310 (also numbering approximately $N^2$) have substantially no voltage bias across the respective memory cells, so the leakage current through such cells is negligible. The only substantial reverse-biased memory cell leakage during the write operation flows through the unselected memory cells within the selected memory plane, namely memory cells 304. This results in substantially lower power dissipation for a given memory array size, or may allow a larger array size for the same amount of power.

With the diodes "pointing" downward toward the substrate as shown, the unselected X-lines and unselected Y-lines on layers below the selected X-line layer (e.g., W3) are all biased at $V_{BIASHIGH}$ which may be equal to a small offset voltage below the programming voltage $V_{PROG}$. Also, the unselected X-lines and unselected Y-lines on layers above the selected Y-line layer (e.g., B4) are all biased at $V_{BIASLOW}$ which may be equal to a small offset voltage above ground.

It should be appreciated that the designations X-line and Y-line on such a serial chain diode stack do not necessarily imply which terminal of the memory cells (i.e., anode or cathode) is coupled to the particular line, as with a back-to-back diode stack. An X-line may be coupled to the anode terminal of memory cells in one associated memory plane (e.g., memory plane W3-B4), and may be coupled to the cathode terminal of memory cells in an adjacent memory plane (e.g., memory plane W3-B2). If a memory plane is selected having the anode terminal coupled to Y-lines rather than X-lines, all the X and Y designations in FIG. 17 may be reversed. A selected Y-line is driven to the $V_{PROG}$ voltage, and a selected X-line is driven to ground. As before, however, the unselected X-lines and unselected Y-lines on layers below the selected "anode-connected" line (e.g., in this example a selected Y-line) are preferably all biased at $V_{BIASHIGH}$, and the unselected X-lines and unselected Y-lines on layers above the selected "cathode-connected" line (e.g., in this example, a selected X-line) are preferably all biased at $V_{BIASLOW}$ (assuming, again, that the diodes in each level are forward biased in a direction toward lower levels of the array).

Figure 18:
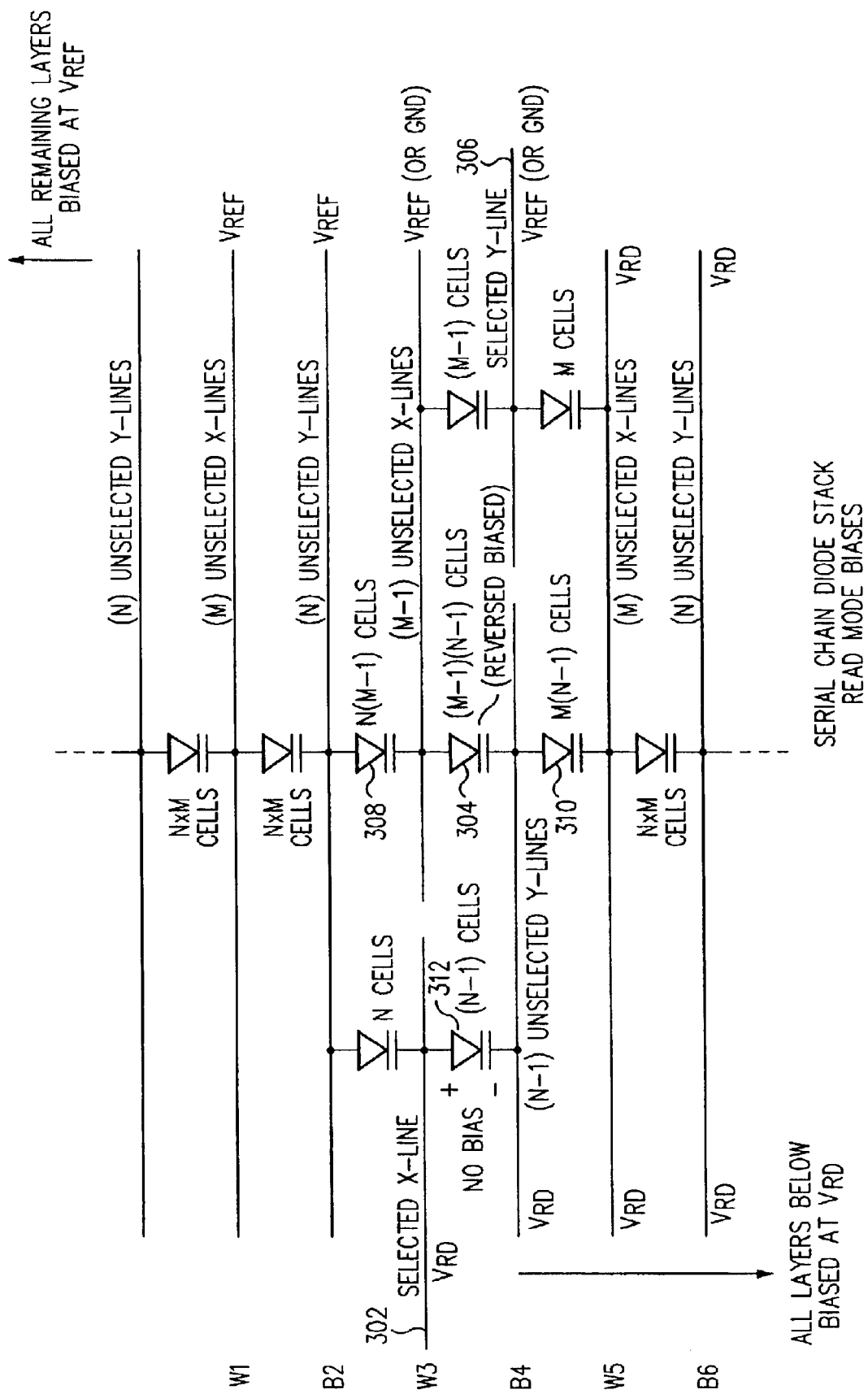
FIG. 18 is a schematic diagram representing a serial chain diode stack-type memory array and indicating a read bias arrangement of array lines on various layers, in accordance with an embodiment of the present invention.

Referring now to FIG. 18, a simplified schematic diagram is shown representing preferred bias conditions in a multi-level serial chain diode stack during a read mode. A selected X-line 302 on the W3 level is driven to a $V_{RD}$ voltage (e.g., usually somewhat less than $V_{DD}$) and a selected Y-line 306 on the B4 level is driven to briefly to ground (or driven to $V_{REF}$) to sense a selected memory cell in the W3-B4 memory plane (not shown). With the bias voltages as shown, the half-selected memory cells 312 on the selected X-line have no bias voltage across their diodes, and consequently do not cause leakage current to flow from the selected X-line. All the current flowing through the selected X-line reaches the selected memory cell, even if at the end of the selected X-line, and flows through the selected memory cell (if programmed) into the selected Y-line. The unselected memory cells 304 (numbering approximately $N^2$) are reversed-biased during the read operation with a voltage that may be as high as $V_{RD}$, but this current does not flow through the selected X-line.

With the diodes "pointing" downward toward the substrate as shown, the unselected X-lines and unselected Y-lines on layers below the selected "anode-line" layer (e.g., W3) are all biased at $V_{RD}$ and the unselected X-lines and unselected Y-lines on layers above the selected "cathode-line" layer (e.g., B4) are all biased at $V_{REF}$ which may, for some embodiments, be equal to around one-half $V_{DD}$.

As with the write case described above, if a memory plane is selected having the anode terminal coupled to Y-lines rather than X-lines, all the X and Y designations in FIG. 17 may be reversed. A selected Y-line is driven to the $V_{RD}$ voltage, and a selected X-line is driven to ground (or $V_{REF}$). The unselected X-lines and unselected Y-lines on layers below the selected "anode-connected" line are preferably all biased at $V_{RD}$, and the unselected X-lines and unselected Y-lines on layers above the selected "cathode-connected" line are preferably all biased at $V_{REF}$ (assuming an array having downward pointing diodes).

Figure 19:
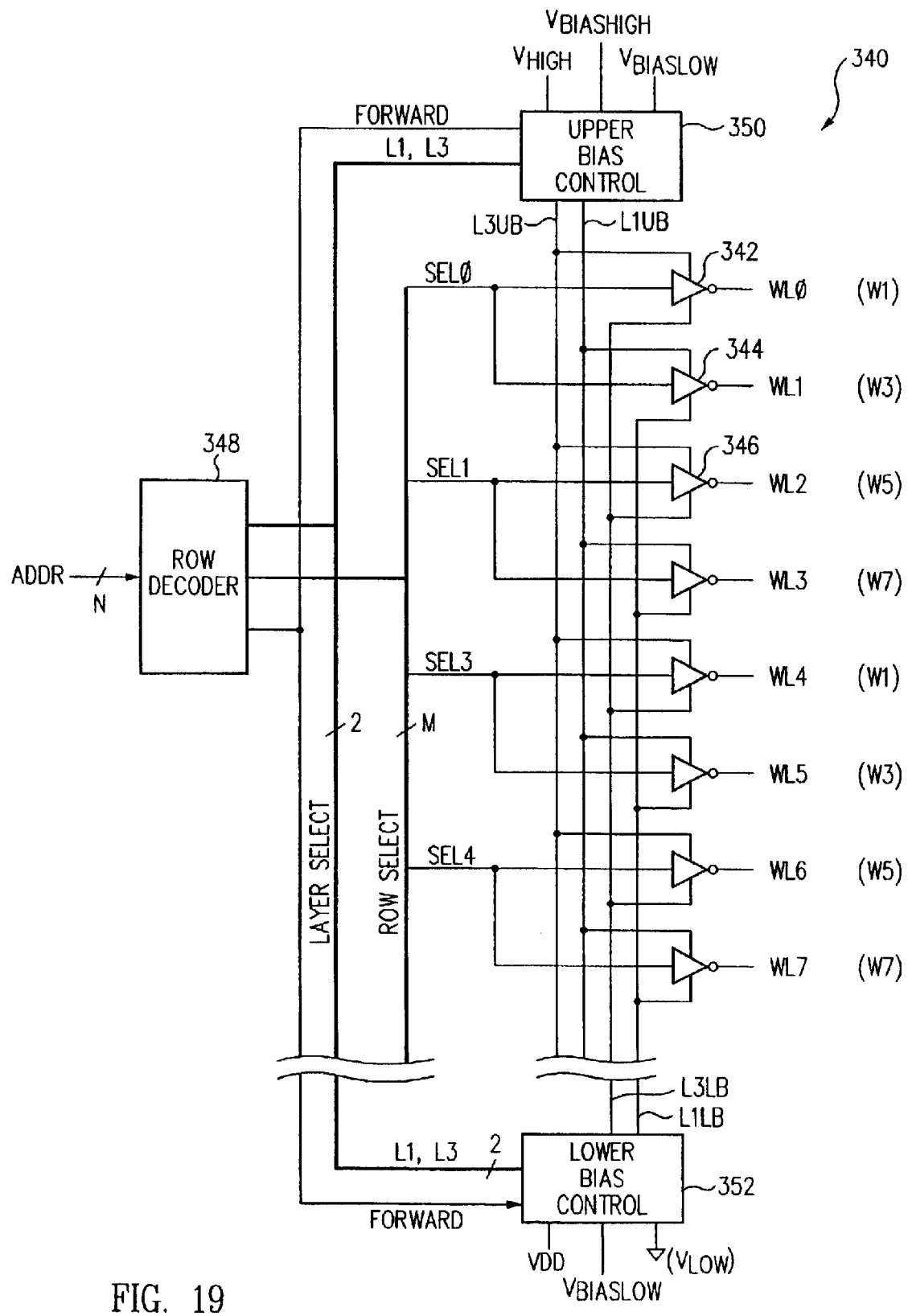
FIG. 19 is a block diagram of a row decoder/word line driver circuit in accordance with the present invention.

As can be appreciated in relation to FIG. 17 and FIG. 18, a given X-line may be driven to any of four different voltages, depending on whether to read or to write a selected memory cell, and depending on the direction of the selected memory cell. Referring now to FIG. 19, an exemplary decoder/driver circuit 340 is depicted in the context of its use as a row decoder/word line driver (i.e., X-line driver). As will be appreciated, such a circuit may also be used for bit lines (Y-lines) as well. Reference should also be taken of the simplified driver circuit shown in FIG. 8.

The decoder/driver circuit 340 includes a respective word line driver (such as 342, 344, 346) for driving a respective word line to one of two voltages received by the respective driver based upon a row select signal received from a row decoder 344. For example, a word line driver 342 receives a SEL0 row select signal and drives the word line WL0 to either a voltage conveyed on an upper bias node L3UB or to a voltage conveyed on a lower bias node L3LB. A pair of driver circuits (such as drivers 342, 344) receives the same decoded row select signal, but different upper and lower bias voltage nodes. The first driver of each pair (e.g., driver 342) drives its word line "up" to a layer 3 upper bias voltage conveyed on a L3UB node, and drives its word line "down" to a layer 3 lower bias voltage conveyed on a L3LB node. The drivers may be simple CMOS inverter circuits "powered" by the upper and lower bias voltages rather than by $V_{DD}$ and ground. In such a case, the driver either connects its word line through a PMOS transistor to the upper bias node L3UB, or through a NMOS transistor to the lower bias node L3LB.

An upper bias control circuit 350 controls which of several input voltages $V_{HIGH}$, $V_{BIASHIGH}$, and $V_{BIASLOW}$ are coupled to each of the L1UB and L3UB nodes for use by the various word line drivers, based upon decoded layer select signals such as L1, L3, and a FORWARD signal indicating the memory cell orientation (e.g., diode direction) for the selected memory plane. A lower bias control circuit 352 controls which of several input voltages $V_{DD}$, $V_{BIASLOW}$, and $V_{LOW}$ (ground) are coupled to each of the L1LB and L3LB nodes for use by the various word line drivers, based also upon the same decoded layer select signals L1, L3 and the FORWARD signal.

Figure 20:
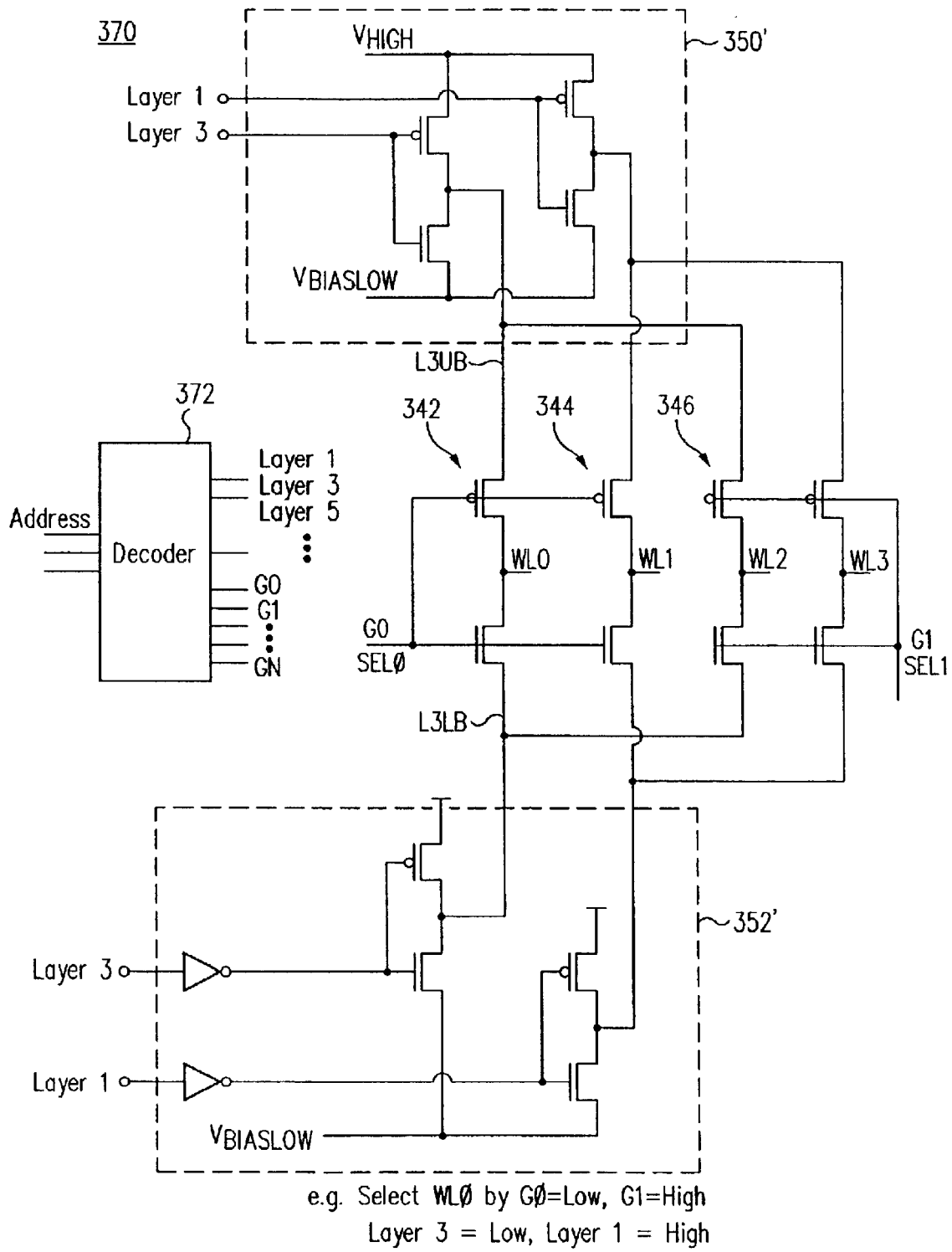
FIG. 20 is a schematic diagram of a word line driver circuit useful for the present invention.

Referring now to FIG. 20, a portion of the decoder/driver circuit 340 is shown suitable for interfacing with a back-to-back diode stack memory array. An upper bias control circuit 350' does not utilize a $V_{BIASHIGH}$ input, but couples the L1UB node to $V_{HIGH}$ or $V_{BIASLOW}$ depending upon whether the L1 (Layer 1) signal is low or high, and couples the L3UB node to $V_{HIGH}$ or $V_{BIASLOW}$ depending upon whether the L3 (Layer 3) signal is low or high. A lower bias control circuit 352' does not utilize a $V_{LOW}$ (i.e., ground) input, but couples the L1LB node to $V_{DD}$ or $V_{BIASLOW}$ depending upon whether the L1 signal is high or low, and couples the L3UB node to $V_{DD}$ or $V_{BIASLOW}$ depending upon whether the L3 signal is high or low. During a write mode, the $V_{HIGH}$ voltage is preferably equal to the programming voltage $V_{PROG}$ and the $V_{BIASLOW}$ voltage is preferably equal to a small offset voltage above ground, but during a read mode, the $V_{HIGH}$ voltage is preferably equal to the read voltage $V_{RD}$ and the $V_{BIASLOW}$ voltage is preferably equal to ground.

Figure 21:
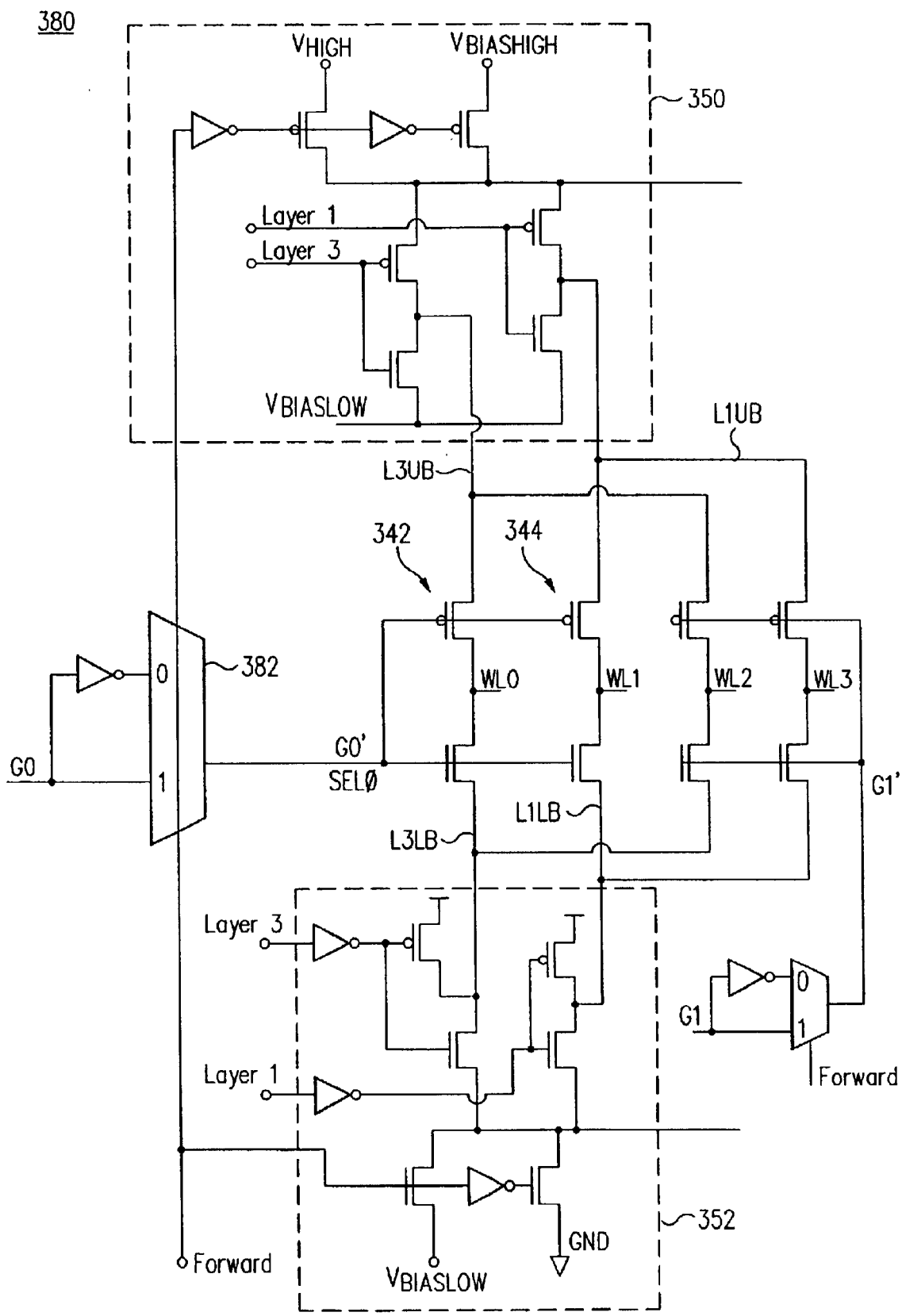
FIG. 21 is a schematic diagram of a word line driver circuit useful for the present invention.

Referring now to FIG. 21, a similar portion of the decoder/driver circuit 340 is shown suitable for interfacing with a serial stack diode stack memory array. An upper bias control circuit 350 couples the L1UB node to $V_{BIASLOW}$ when the L1 signal is high, but when the L1 signal is low, couples the L1UB node to either the $V_{HIGH}$ voltage (if FORWARD is high) or to the $V_{BIASHIGH}$ voltage (if FORWARD is low). The upper bias control circuit 350 also couples the L3UB node to $V_{BIASLOW}$ when the L3 signal is high, but when the L3 signal is low, couples the L3UB node to either the $V_{HIGH}$ voltage (if FORWARD is high) or to the $V_{BIASHIGH}$ voltage (if FORWARD is low). A lower bias control circuit 352 couples the L1LB node to $V_{DD}$ if the L1 signal is high, but if the L1 signal is low, couples the L1UB node to either the $V_{BIASLOW}$ voltage (if FORWARD is high) or to the $V_{LOW}$ (ground) voltage (if FORWARD is low). A multiplexer 382 inverts the polarity of the decoded row select signal based on the directionality of the selected memory plane.

Referring now to FIG. 22, a chart is shown indicating preferred bias voltages for unselected and selected X-lines within a memory plane, for both a "forward-oriented" memory plane (selected memory plane anode terminals coupled to the X-lines) and a "reverse" memory plane (selected memory plane cathode terminals coupled to the X-lines). For programming, the $V_{BIASHIGH}$ is preferably about 0.5–0.8 volts below the programming voltage ($V_{HIGH}$). For read, the $V_{BIASHIGH}$ is preferably about the same as $V_{RD}$.

Referring now to FIG. 23A, an integrated circuit 500 in accordance with one embodiment of the present invention is depicted which includes a three-dimensional serial chain diode stack-type memory array 502. A bi-mode decoder/driver (such as decoder/driver circuit 340 shown in FIG. 19) is provided on each of two adjacent sides of the array 502, labeled as 504 and 508. A sense circuit is also provided on each of the same two sides of the array, labeled 506 and 510. Each X-line is served by the decoder/driver circuit 504 and the sense circuit 506, and each Y-line is served by the decoder/driver circuit 508 and the sense circuit 510.

Referring now to FIG. 23B, an integrated circuit 500 in accordance with another embodiment of the present invention is depicted which includes a three-dimensional serial chain diode stack-type memory array 522. A bi-mode decoder/driver circuit 524 (such as decoder/driver circuit 340 shown in FIG. 19) is provided on one side of the array 522, and a bi-mode sense circuit 526 is provided an adjacent side of the array 522. Each X-line is served by the bi-mode decoder/driver circuit 524, and each Y-line is served by the bi-mode sense circuit 526.

In another embodiment, two interdigitated groups of X-lines are oriented horizontally in the array, and two interdigitated groups of Y-lines are oriented vertically in the array. Each respective group of X-lines or Y-lines is served by a respective decoder/driver circuit and a respective sense circuit on one of the four sides of the array 502.

Preferred embodiments for row and column circuitry serving a plurality of memory arrays, which embodiments are useful alone or in combination with any of the preferred embodiments described herein, are set forth in "Memory Device with Row and Column Decoder Circuits Arranged in a Checkerboard Pattern under a Plurality of Memory Arrays," by Roy E. Scheuerlein, U.S. patent application Ser. No. 09/896,814, filed Jun. 29, 2001, and which application is hereby incorporated by reference.

OTHER EMBODIMENTS

In the above description a conductor is shared by two levels of the memory array (i.e., memory planes). An array may be fabricated where there are two conductors for each level that are not shared with other levels. A dielectric may be used to separate each such level. The different embodiments provide numerous material choices and "post-write diode" choices.

While the invention has been largely described with respect to the embodiments set forth above, the invention is not necessarily limited to these embodiments. Variations and modifications of the embodiments disclosed herein may be made based on the description set forth herein, without departing from the scope and spirit of the invention. In particular, even though the preferred embodiments are described in the context of a passive element memory array, the teachings of the present invention are believed advantageous for use with other types of memory cells, such as certain 3-terminal memory cells. While certain embodiments have been described in the context of a three-dimensional, field-programmable, write once memory array, it should be appreciated that such an array is not necessarily required. Moreover, the embodiments described above are specifically contemplated to be used alone as well as in various combinations.

The instant invention can be applied to any three-dimensional memory array configured as a plurality of levels of interleaved word lines and bit lines, where word lines and/or bit lines are shared between levels, including, but not limited to: (1) the memory described in U.S. Pat. No. 6,034,882 issued on Mar. 7, 2000 and U.S. Pat. No. 6,185,122 issued on Feb. 6, 2001, to Mark G. Johnson, et al., both commonly assigned herewith; (2) the memory array described in U.S. patent application Ser. No. 09/560,626 filed on Apr. 28, 2000, in the name of N. Johan Knall and commonly assigned herewith; (3) the memory array described in U.S. patent application Ser. No. 09/814,727 filed on Mar. 21, 2001, in the name of N. Johan Knall and Mark G. Johnson and commonly assigned herewith, each of which is hereby incorporated by reference.

Preferably, the memory cells are comprised of semiconductor materials, as described in U.S. Pat. No. 6,034,882 to Johnson et al., U.S. Pat. No. 5,835,396 to Zhang, U.S. patent application Ser. No. 09/560,626 by Knall, and U.S. patent application Ser. No. 09/638,428 by Johnson, each of which are hereby incorporated by reference. Specifically an anti-fuse memory cell is preferred. Other types of memory arrays that are stackable over support circuits, such as MRAM and organic passive element arrays, can also be used. MRAM (magnetoresistive random access memory) is based on magnetic memory elements, such as a magnetic tunnel junction (MTJ). MRAM technology is described in "A 2556kb 3.0V ITIMTJ Nonvolatile Magnetoresistive RAM" by Peter K. Naji et al., published in the Digest of Technical Papers of the 2001 IEEE International Solid-State Circuits Conference, ISSCC 2001/Session 7/Technology Directions: Advanced Technologies/7.6, Feb. 6, 2001 and pages 94–95, 404–405 of ISSCC 2001 Visual Supplement, both of which are hereby incorporated by reference. Certain passive element memory cells incorporate layers of organic materials including at least one layer that has a diode-like characteristic conduction and at least one organic material that changes conductivity with the application of an electric field. U.S. Pat. No. 6,055,180 to Gudensen et al. describes organic passive element arrays and is also hereby incorporated by reference. Memory cells comprising materials such as phase-change materials and amorphous solids can also be used. See U.S. Pat. No. 5,751,012 to Wolstenholme et al. and U.S. Pat. No. 4,646,266 to Ovshinsky et al., both of which are hereby incorporated by reference.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Although certain supporting circuits (e.g., decoders, sensing circuits, multiplexers, input/output buffers, etc.) are not specifically described, such circuits are well known, and no particular advantage is afforded by specific variations of such circuits in the context of practicing this invention. Moreover, it is believed that one of ordinary skill in the art, equipped with the teaching of this disclosure, will be able to carry out the invention, including implementing various control circuits inferred but not specifically described herein, using well known circuit techniques and without undue experimentation.

As used herein, a passive element memory array includes a plurality of 2-terminal memory cells, each connected between an associated X-line and an associated Y-line. Such a memory array may be planar or may be a three-dimensional array having more than one plane of memory cells. Each such memory cell has a non-linear conductivity in which the current in a reverse direction (i.e., from cathode to anode) is lower than the current in a forward direction. Application of a voltage from anode to cathode greater than a programming level changes the conductivity of the memory cell. The conductivity may decrease when the memory cell incorporates a fuse technology, or may increase when the memory cell incorporates an antifuse technology. A passive element memory array is not necessarily a one-time programmable (i.e., write once) memory array.

The directionality of X-lines (shown horizontally in the various figures) and Y-lines (shown vertically) is merely convenient for ease of description of the two groups of crossing lines in the array. While X-lines are usually orthogonal to Y-lines, such is not necessarily implied by such terminology. Moreover, the word and bit organization of a memory array may also be easily reversed, having Y-lines organized as word lines and X-lines organized as bit lines. As an additional example, portions of an array may correspond to different output bits of given word. Such various array organizations and configurations are well known in the art, and the invention in intended to comprehend a wide variety of such variations.

Word lines may also be referred to as row lines or X-lines, and bit lines may also be referred to as column lines or Y-lines. The distinction between "word" lines and "bit" lines may carry at least two different connotations to those skilled in the art. When reading a memory array, it is assumed by some practitioners that word lines are "driven" and bit lines are "sensed." In this regard, X-lines (or word lines) are frequently connected to the anode terminal of the memory cells, and Y-lines (or bit lines) are frequently connected to the cathode terminal of the memory cells. Secondly, the memory organization (e.g., data bus width, number of bits simultaneously read during an operation, etc.) may have some association with viewing one set of the two array lines more aligned with data "bits" rather than data "words."

The embodiments described may show a selected word line being driven to a voltage and a selected bit line being sensed, and memory cell anode terminals connected to word lines and cathode terminals connected to bit lines, but other embodiments are specifically contemplated. For example, in a multi-level memory array, an adjacent memory plane may be connected similarly (e.g., a back-to-back diode stack memory array), or may reverse the directionality of memory cells in the adjacent plane (e.g., a serial chain diode stack memory array) so that the anode terminals are connected to bit lines and the cathode terminals to word lines. Consequently, the designations herein of X-lines, word lines, and row lines, and of Y-lines, bit lines, and column lines are illustrative of the various embodiments but should not be viewed in a restrictive sense, but rather a more general sense. For example, sensing circuits described herein may be coupled to word lines rather than bit lines, or may be used for both word lines and bit lines, when sensing a current in a word line rather than in a bit line.

Integrated circuits incorporating a memory array usually subdivide the array into a sometimes large number of smaller arrays, also sometimes known as sub-arrays. As used herein, an array is a contiguous group of memory cells having contiguous word and bit lines generally unbroken by decoders, drivers, sense amplifiers, and input/output circuits. An integrated circuit including a memory array may have one array, more than one array, or even a large number of arrays.

In certain contexts, a write "cycle" may be synonymous with a write "operation." However, when viewed at the boundary of a memory array or memory device, a single external write "cycle" may actually cause several internal write "cycles" or "operations" to be sequentially performed at the memory array level, each writing data to a different group of memory cells. Unless the context so requires, a write cycle referred to herein is an internal write cycle or operation performed at the array level.

Regarding more general terminology used herein, it will be appreciated by one skilled in the art that any of several expressions may be equally well used when describing the operation of a circuit including the various signals and nodes within the circuit. Any kind of signal, whether a logic signal or a more general analog signal, takes the physical form of a voltage level (or for some circuit technologies, a current level) of a node within the circuit. It may be correct to think of signals being conveyed on wires or buses. For example, one might describe a particular circuit operation as "the output of circuit 10 drives the voltage of node 11 toward VDD, thus asserting the signal OUT conveyed on node 11." It is well known in the art to equally describe such a circuit operation as "circuit 10 drives node 11 high," as well as "node 11 is brought high by circuit 10," "circuit 10 pulls the OUT signal high" and "circuit 10 drives OUT high." Such shorthand phrases for describing circuit operation are more efficient to communicate details of circuit operation, particularly because the schematic diagrams in the figures clearly associate various signal names with the corresponding circuit blocks and node names. For convenience, an otherwise unnamed node conveying the CLK signal may be referred to as the CLK node. Similarly, phrases such as "pull high," "drive high," and "charge" are generally synonymous unless otherwise distinguished, as are the phrases "pull low," "drive low," and "discharge." It is believed that use of these more concise descriptive expressions enhances clarity and teaching of the disclosure. It is to be appreciated by those skilled in the art that each of these and other similar phrases may be interchangeably used to describe common circuit operation, and no subtle inferences should be read into varied usage within this description.

Regarding power supplies, a single positive power supply voltage (e.g., a 2.5 volt power supply) used to power a circuit is frequently named the "VDD" power supply. In an integrated circuit, transistors and other circuit elements are actually connected to a VDD terminal or a VDD node, which is then operably connected to the VDD power supply. The colloquial use of phrases such as "tied to VDD" or "connected to VDD" is understood to mean "connected to the VDD node", which is typically then operably connected to actually receive the VDD power supply voltage during use of the integrated circuit.

The reference voltage for such a single power supply circuit is frequently called "VSS." Transistors and other circuit elements are actually connected to a VSS terminal or a VSS node, which is then operably connected to the VSS power supply during use of the integrated circuit. Frequently the VSS terminal is connected to a ground reference potential, or just "ground." Describing a node which is "grounded" by a particular transistor or circuit (unless otherwise defined) means the same as being "pulled low" or "pulled to ground" by the transistor or circuit.

The block diagrams herein may be described using the terminology of a single node connecting the blocks. Nonetheless, it should be appreciated that, when required by the context, such a "node" may actually represent a pair of nodes for conveying a differential signal, or may represent multiple separate wires (e.g., a bus) for carrying several related signals or for carrying a plurality of signals forming a digital word.

The foregoing details description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, that are intended to define the scope of this invention.

On Mar. 21, 2001, the following U.S. patent applications were filed, each of which is hereby incorporated by reference: "Memory Device with Row and Column Decoder Circuits Arranged in a Checkerboard Pattern under a Plurality of Memory Arrays," U.S. Provisional Application No. 60/277,794; "Passive Element Memory Array and Related Circuits Useful Therefor," U.S. Provisional Application No. 60/277,815; "Three-Dimensional Memory Array," U.S. Provisional Application No. 60/277,738; and "Three-Dimensional Memory Array and Method of Fabrication," U.S. application Ser. No. 09/814,727.

On Jun. 29, 2001, the following U.S. patent applications were filed, each of which is hereby incorporated by reference: "Method and Apparatus for Writing Memory Arrays Using External Source of High Programming Voltage," U.S. patent application Ser. No. 09/897,785; "Three-Dimensional Memory Array Incorporating Serial Chain Diode Stack," U.S. patent application Ser. No. _____ "Method and Apparatus for Biasing Selected and Unselected Array Lines when Writing a Memory Array," U.S. patent application Ser. No. 09/897,771; "Memory Device with Row and Column Decoder Circuits Arranged in a Checkerboard Pattern under a Plurality of Memory Arrays," U.S. patent application Ser. No. 09/896,814; "Method and System for Increasing Programming Bandwidth in a Non-Volatile Memory Device," U.S. patent application Ser. No. 09/895,960; "Method and Apparatus for Discharging Memory Array Lines," U.S. patent application Ser. No. 09/897,784; "Current Sensing Method and Apparatus Particularly Useful for a Memory Array of Cells Having Diode-Like Characteristics," U.S. patent application Ser. No. 09/896,468; "Memory Array Incorporating Noise Detection Line," U.S. patent application Ser. No. 09/897,704; and "Memory Device and Method for Sensing while Programming a Non-Volatile Memory Cell," U.S. patent application Ser. No. 09/896,815.

What is claimed is:

1. A multi-level memory array comprising:
   on alternate levels of the memory array, a respective plurality of parallel spaced-apart rail-stacks disposed above the substrate running in a first direction;
   on the other levels of the memory array, a respective plurality of parallel spaced-apart rail-stacks disposed above the substrate and running in a second direction different than the first direction, such that a projection of the rail-stacks on one level to the rail-stacks on an adjacent level defines intersections therebetween; and
   a layer of low conducting material separating the rail-stacks on one level from the rail-stacks on an adjacent level, the layer of low conducting material at each intersection of rail-stacks separating a first conductivity type doped semiconductor material in the rail-stack below the intersection from a material other than a first conductivity type doped semiconductor material in the rail-stack above the intersection.

2. The memory array defined by claim 1 wherein:
   the layer of low conducting material at each intersection of rail-stacks separates a first conductivity type doped semiconductor material in the rail-stack below the intersection from a metallic layer in the rail-stack above the intersection.

3. The memory array defined by claim 1 wherein:
   the layer of low conducting material at each intersection of rail-stacks separates a first conductivity type doped semiconductor material in the rail-stack below the intersection from a second conductivity type doped semiconductor material in the rail-stack above the intersection.

4. The memory array defined by claim 3 wherein the semiconductor material is silicon, and the silicon on one side of each said intersection is more lightly doped than the silicon on the opposite side of said respective intersection.

5. The memory array defined by claim 4 wherein the side of the intersection having the more lightly doped silicon includes a more heavily doped silicon region disposed between the more lightly doped silicon and its respective conductor.

6. The memory array defined by claim 5 wherein the low conducting material comprises silicon dioxide.

7. The memory array defined by claim 5 wherein the low conducting material layer comprises silicon nitride.

8. The memory array defined by claim 5 wherein the low conducting material layer comprises undoped silicon.

9. The memory array defined by claim 5 wherein the rail-stacks include a conductor comprising a metal.

10. The memory array defined by claim 9 wherein each rail-stack conductor is sandwiched between silicon layers.

11. The memory array defined by claim 1 wherein:
    the layer of low conducting material at each intersection of rail-stacks can be changed to a higher conducting state to program the array.

12. The memory array defined by claim 1 wherein the semiconductor material is silicon.

13. The memory array defined by claim 12 wherein the passage of a sufficient current from one of the rail-stacks on a level to one of the rail-stacks on an adjacent level causes a diode to form at the intersection of these respective rail-stacks.

14. The memory array defined by claim 13 wherein the diode formed at each intersection of rail-stacks is a p+n− doped silicon diode.

15. The memory array defined by claim 14 wherein the layer of low conducting material at each level is silicon dioxide.

16. The memory array defined by claim 15 wherein the layer of low conducting material is substantially continuous at each level.

17. The memory array defined by claim 16 wherein the layer of low conducting material is blanket deposited.

18. The memory array defined by claim 16 wherein the dielectric layer comprises ONO.

19. The memory array defined by claim 13 wherein the diode formed at each intersection of rail-stacks is a p−n+ doped silicon diode.

20. The memory array defined by claim 13 wherein the diode formed at each intersection of rail-stacks is a Schottky diode.

21. The memory array defined by claim 1 wherein the layer of low conducting material provides a physical barrier between vertically adjacent rail-stacks, substantially minimizing sidewall leakage.

22. The memory array defined by claim 1 wherein each rail-stack comprises:
    a conductor sandwiched between respective silicon layers above and below the conductor; and
    the silicon layer above the conductor is of a first conductivity type for all rail-stacks.

23. The memory array defined by claim 1 wherein the layer of low conducting material is grown from a semiconductor layer.

24. A multi-level memory array comprising:
    on alternate levels of the memory array, a respective plurality of parallel spaced-apart conductors disposed above the substrate running in a first direction;
    on the other levels of the memory array, a respective plurality of parallel spaced-apart conductors disposed above the substrate and running in a second direction different than the first direction, such that a projection of the conductors on one level to the conductors on an adjacent level defines intersections therebetween; and a programmable layer of material separating the conductors on one level from the conductors on an adjacent level, the programmable layer of material at each intersection of conductors having a conductivity capable of being modified by application of a voltage and forming, at least before or after the application of the voltage, a steering device between successive levels of conductors;

wherein the steering devices between successive levels of conductors are each oriented in a like direction.

25. The array defined by claim 24 wherein each of the plurality of conductors is sandwiched between layers of silicon.

26. The array defined by claim 24 wherein the programmable layer of material comprises an antifuse material layer.

27. The array defined by claim 24 wherein the programmable layer of material comprises a fuse material layer.

28. The array defined by claim 24 wherein the programmable layer of material comprises an organic material layer.

29. The array defined by claim 24 wherein the programmable layer of material comprises a chalcogenide material layer.

30. A multi-level non-volatile memory array comprising:

a plurality of first conductors disposed at a first and third level running generally in a first direction above a substrate;

a plurality of second conductors disposed at a second and fourth level above the substrate and running in a second direction, and a plurality of dielectric regions each disposed respectively between successive levels of the first and second conductors which are capable of being selectively breached to form a diode between successive levels of the first and second conductors;

wherein the resulting diodes between successive levels of the first and second conductors are each oriented in a like direction.

31. The array defined by claim 30 wherein:

each of the plurality of first conductors are sandwiched between layers of silicon; and each of the plurality of second conductors are sandwiched between layers of silicon.

32. The array defined by claim 31 wherein:

the first and second conductors are sandwiched between layers of silicon of opposite conductivity type doping.

33. A multi-level non-volatile memory array comprising:

a plurality of first rail-stacks disposed at a first and third level running generally in a first direction above a substrate;

a plurality of second rail-stacks disposed at a second and fourth level above the substrate and running in a second direction, and a plurality of dielectric regions each disposed respectively between successive levels of the first and second rail-stacks which are capable of being selectively breached to form a diode between successive levels of the first and second rail-stacks;

wherein the resulting diodes between successive levels of the first and second rail-stacks are each oriented in a like direction.

34. The array defined by claim 33 wherein:

each of the plurality of first rail-stacks comprises first conductors sandwiched between layers of silicon; and each of the plurality of second rail-stacks comprises second conductors sandwiched between layers of silicon.

35. The array defined by claim 34 wherein:

the first and second conductors are sandwiched between layers of silicon of opposite conductivity type doping.

36. The array defined by claim 34 wherein:

the layers of silicon on at least one side of the first conductors are more heavily doped adjacent to the first conductor than they are further from the first conductor; and the layers of silicon on at least one side of the second conductors are more heavily doped adjacent to the second conductors than they are further from the second conductors.

37. The array defined by claim 36 wherein the resulting diodes formed are p+n− diodes.

38. The array defined by claim 36 wherein the resulting diodes formed are p−n+ diodes.

39. The array defined by claim 33 wherein the dielectric regions are blanket deposited dielectric layers.

40. The array defined by claim 38 where the dielectric layers are substantially continuous, forming a physical barrier between levels of rail-stacks.

41. The array defined by claim 33 wherein the dielectric regions are grown from one of the layers of silicon.

* * * * *

UNITED STATES PATENT AND TRADEMARK OFFICE
CERTIFICATE OF CORRECTION

PATENT NO. : 6,784,517 B2
DATED : August 31, 2004
INVENTOR(S) : Kleveland et al.

It is certified that error appears in the above-identified patent and that said Letters Patent is hereby corrected as shown below:

Title page,
Item [75], Inventor, "Johann" should read -- Johan --.
Item [56], References Cited, U. S. PATENT DOCUMENTS, insert
-- 6,291,836    9/2001      Kramer et al.       257/50
   4,597,162    7/1986      Johnson et al.      438/16
   5,726,484    3/1998      Hart et al.         257/530 --.

Column 11,
Line 63, "suicides" should read -- silicides --.

Column 22,
Line 43, "claim 38" should read -- claim 39 --.

Signed and Sealed this

Third Day of January, 2006

JON W. DUDAS
*Director of the United States Patent and Trademark Office*